(12) United States Patent
Jiang

(10) Patent No.: US 12,075,579 B2
(45) Date of Patent: Aug. 27, 2024

(54) HINGE, FLEXIBLE DISPLAY PANEL, AND ELECTRONIC DEVICE

(71) Applicant: WUHAN CHINA STAR OPTOELECTRONICS SEMICONDUCTOR DISPLAY TECHNOLOGY CO., LTD., Hubei (CN)

(72) Inventor: Guobao Jiang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 366 days.

(21) Appl. No.: 17/605,247

(22) PCT Filed: Sep. 1, 2021

(86) PCT No.: PCT/CN2021/116016
§ 371 (c)(1),
(2) Date: Oct. 21, 2021

(87) PCT Pub. No.: WO2023/279504
PCT Pub. Date: Jan. 12, 2023

(65) Prior Publication Data
US 2023/0007797 A1 Jan. 5, 2023

(30) Foreign Application Priority Data
Jul. 5, 2021 (CN) .......................... 202110756204.8

(51) Int. Cl.
*H05K 5/02* (2006.01)
*G09F 9/30* (2006.01)

(52) U.S. Cl.
CPC .......... *H05K 5/0226* (2013.01); *G09F 9/301* (2013.01)

(58) Field of Classification Search
None
See application file for complete search history.

(56) References Cited

U.S. PATENT DOCUMENTS

| 9,801,290 | B2* | 10/2017 | Ahn | H05K 5/0017 |
| 10,028,395 | B2* | 7/2018 | Chen | G06F 1/1626 |
| 10,694,623 | B2* | 6/2020 | Park | H05K 5/0226 |
| 11,550,368 | B2* | 1/2023 | Huang | H04M 1/0268 |

FOREIGN PATENT DOCUMENTS

| CN | 104867406 A | 8/2015 |
| CN | 106708171 A | 5/2017 |
| CN | 109979328 A | 7/2019 |
| CN | 112901643 A | 6/2021 |
| JP | 2002121955 A | 4/2002 |

* cited by examiner

*Primary Examiner* — James Wu
*Assistant Examiner* — Christopher L Augustin
(74) *Attorney, Agent, or Firm* — Rivka Friedman

(57) ABSTRACT

The present application provides a hinge, a flexible display panel, and an electronic device. The electronic device includes a flexible display panel including a flexible portion and a hinge, and the hinge includes a fixing bracket, a rotating mechanism, and a first support plate. When the flexible portion is in a flat state, the first support plate supports the flexible portion to reduce creases of the flexible portion. When the flexible portion is in a bent state, the first support plate is away from the flexible portion to prevent the flexible display panel from being pressed.

17 Claims, 16 Drawing Sheets

HINGE, FLEXIBLE DISPLAY PANEL, AND ELECTRONIC DEVICE

FIELD OF INVENTION

The present disclosure relates to display technology field, specifically to a hinge, a flexible display panel, and an electronic device.

BACKGROUND OF INVENTION

With the development of display technology, various displays with different characteristics have emerged to meet different use requirements. The development trend of intelligence, portability and flexibility is one of the main development directions of electronic devices. The most prominent advantage of the flexible display technology over conventional flat panel display technology is that it breaks through the inherent concept of the original two-dimensional display and extends the application field of the display technology to more portable electronic devices. The user may fold or crimp the electronic device having the flexible display panel as needed, so as to reduce the size of the electronic device and improve the portability of the electronic device.

SUMMARY OF INVENTION

Technical Problem

At present, a flexible display panel used in a foldable electronic device is relative compactness, has poor bending resistance and impact resistance, and lacks support for a flexible portion of the flexible display panel. Irreversible creases are easily generated during repeated folding and unfolding, which not only affects flatness of the flexible display panel, but also results in a significant deterioration of the display effect of the flexible display panel.

In summary, there is a problem of creasing of a flexible portion of a conventional flexible display panel. Therefore, it is necessary to provide a display panel and a display device to improve this defect.

Technical Solution

Embodiments of the present disclosure provide a hinge, a flexible display panel, and an electronic device for solving a problem that a flexible portion of a conventional flexible display panel has a crease.

An embodiment of the present disclosure provides a flexible display panel comprising:

a flexible display panel body comprising a flexible portion; and a hinge comprising:

a fixing bracket;

a moving mechanism movably connected to the fixing bracket; and a support member comprising a first support plate, the first support plate is positioned between the flexible portion and the moving mechanism and connected to the moving mechanism to approach or move away from the fixing bracket under a driving of the moving mechanism, wherein when the flexible portion is in a flat state, the first support plate is away from the fixing bracket and supports the flexible portion, when the flexible portion is in a bent state, the first support plate approaches the fixing bracket.

According to an embodiment of the present disclosure, when the flexible portion is in the bent state, there is a gap between the first support plate and the flexible portion.

According to an embodiment of the present disclosure, the moving mechanism comprises:

a rotating mechanism rotatably connected to the fixing bracket; and a movement block movably connected to the rotating mechanism, the first support plate is connected to the movement block.

According to an embodiment of the present disclosure, the rotating mechanism comprises:

a first rotating mechanism rotatably connected to the fixing bracket; and a second rotating mechanism rotatably connected to the fixing bracket and disposed opposite to the first rotating mechanism, wherein the movement block is movably connected to the first rotating mechanism and the second rotating mechanism.

According to an embodiment of the present disclosure, the fixing bracket is provided with a first sliding groove, the movement block is slidably mounted in the first sliding groove, and wherein a protrusion is disposed on a wall surface of the first sliding groove, the movement block is provided with a groove, and the protrusion is slidably accommodated in the groove.

According to an embodiment of the present disclosure, the first rotating mechanism comprises a first rotating member and a first transmission member, and the second rotating mechanism comprises a second rotating member and a second transmission member, and wherein the first rotating member is rotatably connected to the fixing bracket, the first transmission member is fixedly connected to the first rotating member, the first transmission member is movably connected to the movement block, the second rotating member is rotatably connected to the fixing bracket, the second transmission member is fixedly connected to the second rotating member, and the second transmission member is movably connected to the movement block.

According to an embodiment of the present disclosure, the first transmission member comprises a first gear, the second transmission member comprises a second gear, and the movement block comprises a rack, and wherein the first gear is sleeved on the first rotating member, the second gear is sleeved on the second rotating member, and both the first gear and the second gear are engaged with the rack.

According to an embodiment of the present disclosure, the movement block comprises a base portion, the rack is disposed outside of the base portion, and the base portion is integrally formed with the rack.

According to an embodiment of the present disclosure, the first transmission member comprises a first link, and the second transmission member comprises a second link, and wherein one end of the first link is fixedly connected to the first rotating member, another end of the first link is rotatably connected to the movement block, one end of the second link is fixedly connected to the second rotating member, and another end of the second link is rotatably connected to the movement block.

According to an embodiment of the present disclosure, the hinge further comprises a fixing mechanism, the fixing mechanism comprises a first fixing member and a first elastic member, wherein the first fixing member passes through the fixing bracket and is fixedly connected to the first support plate, one end of the first elastic member is connected to the fixing bracket, and another end of the first elastic member is connected to the first fixing member, and the first elastic member is in an elastically deformed state when the flexible portion is in the flat state or the bent state.

According to an embodiment of the present disclosure, the fixing bracket comprises a fixing block, the fixing block comprises a body portion, and a first connecting portion and a second connecting portion extending from opposite sides of the body portion, and the body portion is provided with a through hole, and wherein the first rotating member passes through the first connection portion, the second rotating member passes through the second connection portion, the first fixing member passes through the through hole and is fixedly connected to the first support plate, and the one end of the first elastic member is connected to an inner wall of the body portion surrounding the through hole.

According to an embodiment of the present disclosure, the hinge further comprises a holding mechanism, the holding mechanism comprises a first holding arm, a second holding arm and a first holding member, the first holding member is provided with a first protrusion and a second protrusion, the first holding arm is provided with a first groove, and the second holding arm is provided with a second groove, wherein the first holding arm is connected to the first rotating member, the second holding arm is connected to the second rotating member, and the first rotating member and the second rotating member are rotatably connected to the first holding member, and wherein when the flexible portion is in one of the flat state and the bent state, the first groove accommodates the first protrusion and the second groove accommodates the second protrusion, when the flexible portion is in another of the bent state and the flat state, the first protrusion is disengaged from the first groove and the second protrusion is disengaged from the second groove.

According to an embodiment of the present disclosure, the holding mechanism further comprises a second holding member, the second holding member is provided with a third protrusion and a fourth protrusion, the first holding arm is provided with a third groove, and the second holding arm is provided with a fourth groove, and wherein when the flexible portion is in one of the flat state and the bent state, the third groove accommodates the third protrusion, and the fourth groove accommodates the fourth protrusion, when the flexible portion is in another of the bent state and the flat state, the third protrusion is disengaged from the third groove, and the fourth protrusion is disengaged from the fourth groove.

According to an embodiment of the present disclosure, the holding mechanism further comprises a second elastic member, a third elastic member, a fourth elastic member, a fifth elastic member, and a first stopper, and wherein the second elastic member and the third elastic member are sleeved on the first rotating member, the second elastic member is sandwiched between the first holding member and the first connecting portion, and the third elastic member is sandwiched between the second holding member and the first stopper; the fourth elastic member and the fifth elastic member are sleeved on the second rotating member, the fourth elastic member is sandwiched between the first holding member and the second connecting portion, and the fifth elastic member is sandwiched between the second holding member and the first stopper.

According to an embodiment of the present disclosure, the support member further comprises a second support plate and a third support plate, and the flexible display panel body comprises a first portion and a second portion on opposite sides of the flexible portion, and wherein the second support plate is connected to the first holding arm to move under a driving of the first holding arm, the third support plate is connected to the second holding arm to move under a driving of the second holding arm, the second support plate supports the first portion, and the third support plate supports the second portion.

According to an embodiment of the present disclosure, the hinge further comprises a second fixing member and a third fixing member, the second support plate is provided with a second sliding groove, the third support plate is provided with a third sliding groove, the second fixing member passes through the second sliding groove and is fixedly connected to the first holding arm, and the third fixing member passes through the third sliding groove and is fixedly connected to the second holding arm, and wherein a position of the second fixing member in the second sliding groove when the flexible portion is in the flat state is different from a position of the second fixing member in the second sliding groove when the flexible portion is in the bent state; a position of the third fixing member in the third sliding groove when the flexible portion is in the flat state is different from a position of the third fixing member in the third sliding groove when the flexible portion is in the bent state.

Embodiments of the present disclosure provide an electronic device comprising a flexible display panel, the flexible display panel comprises:

a flexible display panel body comprising a flexible portion; and a hinge comprising:

a fixing bracket;

a moving mechanism movably connected to the fixing bracket; and a support member comprising a first support plate positioned between the flexible portion and the moving mechanism, the first support plate is connected to the moving mechanism to approach or move away from the fixing bracket under a driving of the moving mechanism, and wherein when the flexible portion is in a flat state, the first support plate is away from the fixing bracket and supports the flexible portion; when the flexible portion is in a bent state, the first support plate is close to the fixing bracket.

An embodiment of the present disclosure further provides a hinge comprising:

a fixing bracket;

a moving mechanism movably connected to the fixing bracket; and a support member comprising a first support plate connected to the moving mechanism to approach or move away from the fixing bracket under a driving of the moving mechanism.

According to an embodiment of the present application, the moving mechanism includes a rotating mechanism and a movement block;

a rotating mechanism rotatably connected to the fixing bracket; and a movement block movably connected to the rotating mechanism, the first support plate is connected to the movement block.

According to an embodiment of the present disclosure, the rotating mechanism includes:

a first rotating mechanism comprising a first rotating member and a first transmission member; and a second rotating mechanism comprising a second rotating member and a second transmission member, and wherein the first rotating member is rotatably connected to the fixed bracket, the first transmission member is fixedly connected to the first rotating member, the second rotating member is rotatably connected to the fixing bracket, the second transmission member is fixedly connected to the second rotating member, and the movement block is movably connected to the first transmission member and the second transmission member.

Advantageous Effects

The advantageous effects of the embodiments of the present disclosure are: an embodiment of the present disclosure provides a hinge, a flexible display panel, and an electronic device, the electronic device includes a flexible display panel including a flexible display panel body and a hinge, the flexible display panel body includes a flexible portion, the hinge includes a fixing bracket, a rotating mechanism and a support member, and the moving mechanism is movably connected to the fixing bracket. When the flexible portion is in a flat state, a first support plate is far away from the fixing bracket and supports the flexible portion, so that a step difference between the flexible portion and other portions of the flexible display panel body is reduced, thereby improving flatness of the flexible display panel and reducing creases of the flexible portion. When the flexible portion is in a bent state, the first support plate is far away from the flexible portion, thereby providing a space for accommodating the flexible display panel and preventing the flexible display panel from being pressed during bending.

DESCRIPTION OF DRAWINGS

In order to more clearly explain the technical solutions in the embodiments of the present disclosure or the prior art, the following will briefly introduce the drawings required in the description of the embodiments or the prior art. Obviously, the drawings in the following description are only some embodiments of the present disclosure. For those ordinary skilled in the art, without paying any creative work, other drawings can be obtained based on these drawings.

DETAILED DESCRIPTION OF EMBODIMENTS

Figure 1:
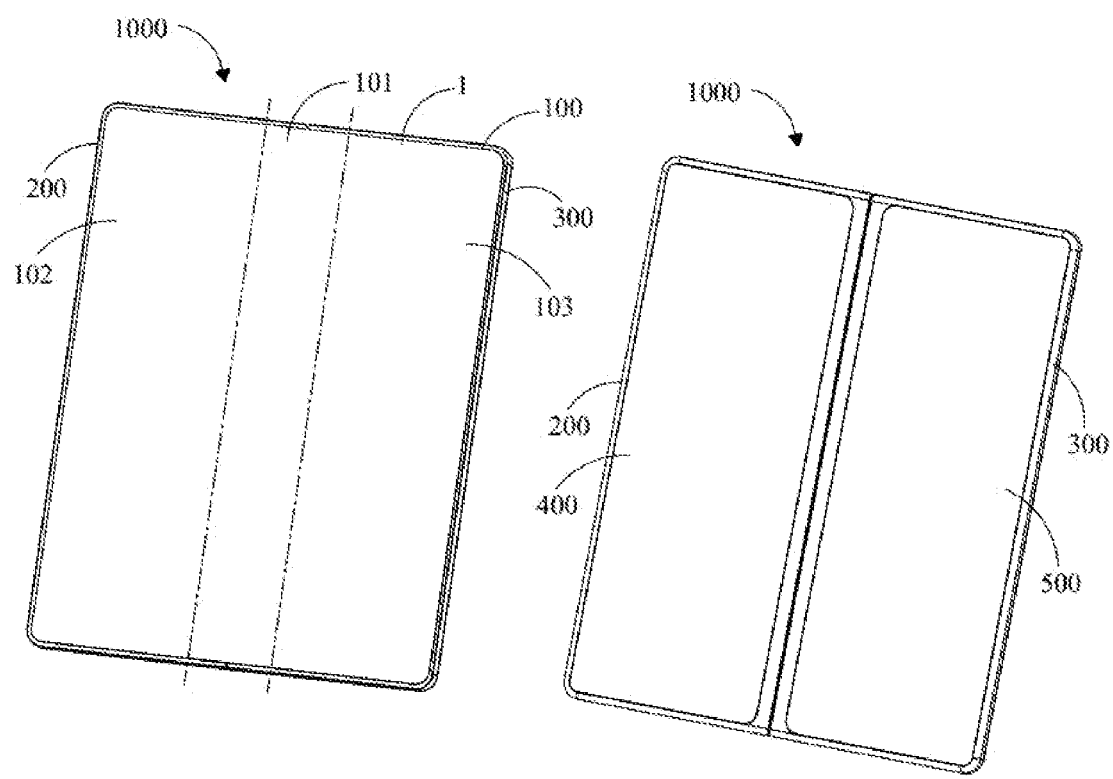
FIG. 1 is a schematic structural diagram of front and back sides of an electronic device in a flat state according to an embodiment of the present disclosure.

The description of the following embodiments refers to the attached drawings to illustrate specific embodiments in which the present disclosure can be implemented. The directional terms mentioned in the present disclosure, such as [up], [down], [front], [back], [left], [right], [inner], [outer], [side], etc., are only the direction of the attached drawings. Therefore, the directional terms used are used to describe and understand the present disclosure, rather than to limit the present disclosure. In the drawings, units with similar structures are indicated by the same reference numerals.

The disclosure will be further described below with reference to the accompanying drawings and specific embodiments:

An embodiment of the present disclosure provides a hinge 2, a flexible display panel 100, and an electronic device 1000. The electronic device 1000 includes the flexible display panel 100, and the flexible display panel 100 includes the hinge 2.

In the embodiment of the present disclosure, the electronic device 1000 may be a mobile terminal, such as a smart phone, a tablet computer, a notebook computer, or the like. The electronic device 1000 may also be a wearable terminal such as a smart watch, a smart bracelet, an intelligent eyewear, an augmented reality device, or the like. The electronic device 1000 may also be a fixed terminal such as a desktop computer, a television, or the like.

Figure 2:
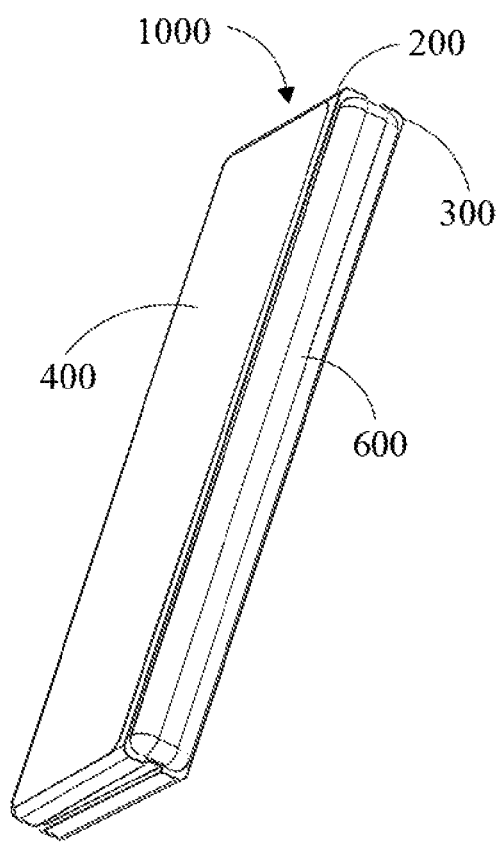
FIG. 2 is a schematic structural diagram of the electronic device in a folded state according to an embodiment of the present disclosure.
Figure 3:
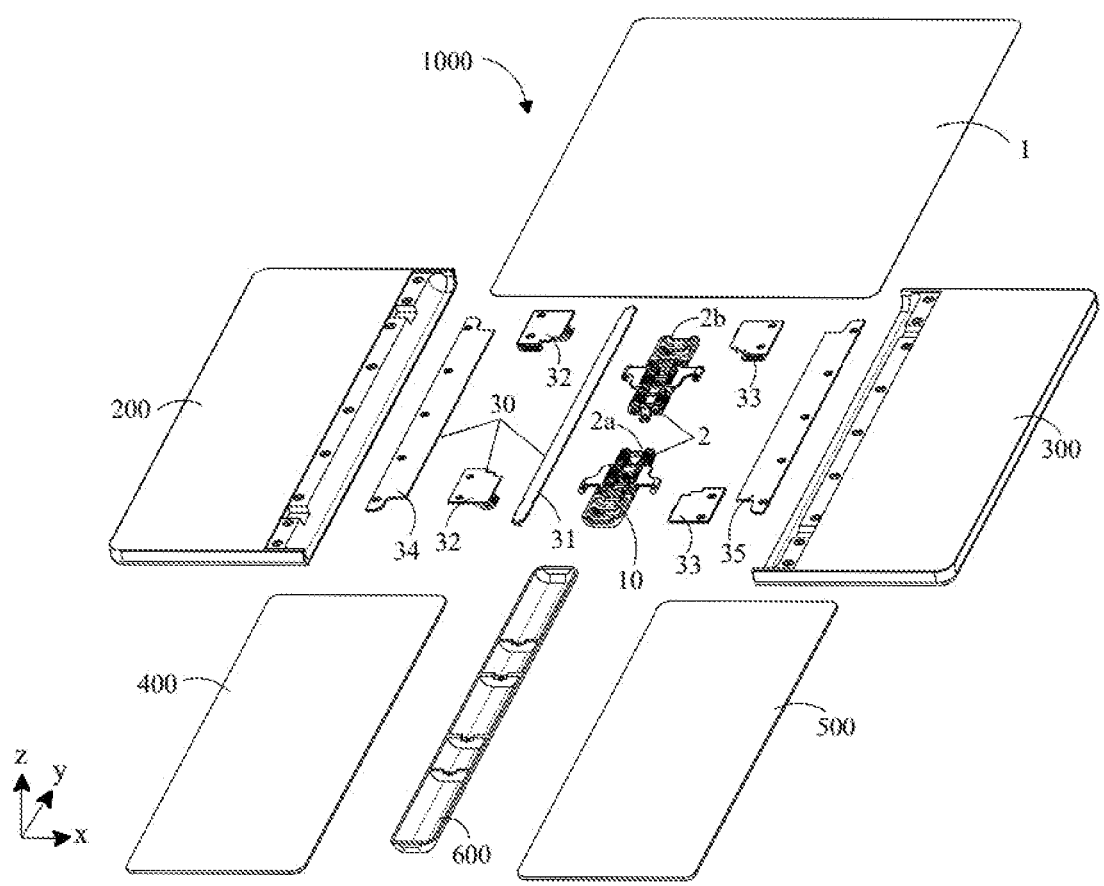
FIG. 3 is an exploded view of the electronic device according to an embodiment of the present disclosure.

As shown in FIGS. 1 to 3, FIG. 1 is a schematic structural diagram of front and back sides of an electronic device in a flat state according to an embodiment of the present disclosure, FIG. 2 is a schematic structural diagram of the electronic device in a folded state according to an embodiment of the present disclosure, and FIG. 3 is an exploded schematic diagram of the electronic device according to an embodiment of the present disclosure. The electronic device 1000 includes the flexible display panel 100, a first housing 200, a second housing 300, a first backplane 400, a second backplane 500, and a third housing 600.

The flexible display panel 100 includes a flexible display panel body 1 including a flexible portion 101, and a first portion 102 and a second portion 103 located at opposite sides of the flexible portion 101, and the flexible portion 101 is a portion of the flexible display panel body 1 that can be folded. The first portion 102 may be disposed on at least a portion of the front side of the first housing 200, and the second portion 103 may be disposed on at least a portion of the front side of the second housing 300.

The first backplane 400 is disposed on a side of the first housing 200 facing away from the flexible display panel 100, and the second backplane 500 is disposed on a side of the second housing 300 facing away from the flexible display panel 100. The first housing 200 and the second housing 300 may have a separate space, the electronic components, such as a motherboard, a printed circuit board, a battery and the like, in the electronic device may be accommodated in the space, these electronic components are required to drive the flexible display panel 100.

It should be noted that the electronic device 1000 may have at least one rotating axis for folding the electronic device 1000, hereinafter, a first direction x indicates a direction perpendicular to the rotating axis, a second direction y indicates a direction parallel to the rotating axis, a third direction z indicates a thickness direction of the electronic device 1000, and the display surface of the electronic device may be defined by the first direction x and the second direction y.

The flexible display panel 100 further includes the hinge 2 including a first hinge 2a and a second hinge 2b disposed on opposite ends of the third housing 600, respectively. Each of the first hinge 2a and the second hinge 2b includes a fixing bracket 10 and a moving mechanism 20 movably connected to the fixing bracket 10, and the first hinge 2a and the second hinge 2b may be disposed between the first housing 200 and the second housing 300. Each of the moving mechanisms 20 of the first hinge 2a and the second hinge 2b is connected to the first housing 200 and the second housing 300, respectively, and the moving mechanism 20 may be configured to rotate the first housing 200 and the second housing 300 about two rotating axes parallel to the second direction y and spaced apart in the first direction x.

In the embodiment of the present disclosure, the structures of the first hinge 2a and the second hinge 2b are the same, and the movement processes are the same. Hereinafter, the schematic diagrams will only be described with reference to the structure of the first hinge 2a as an example, and details will not be described herein again. In practical application, the structures of the first hinge 2a and the second hinge 2b may be different, provided that the first hinge 2a and the second hinge 2b are capable of synchronously rotating the first housing 200 and the second housing 300.

It should be noted that hereinafter, the flat state may refer to a state in which the electronic device 1000 is fully unfolded, and the front side of the first housing 200 and the front side of the second housing 300 may form a plane such that an angle of about 180 degrees is formed between the front side of the first housing 200 and the front side of the second housing 300. The folded state includes a fully folded state and a transition folded state, the fully folded state may refer to a state in which the electronic device 1000 is fully folded, and the front side of the first housing 200 and the front side of the second housing 300 may face each other such that an angle of about zero degree is formed between the front side of the first housing 200 and the front side of the second housing 300. The transition folded state may mean that the electronic device 1000 is in any transition state between the flat state and the fully folded state, and an included angle that is greater than zero degree and less than 180 degrees is formed between the front side of the first housing 200 and the front side of the second housing 300.

The third housing 600 may be disposed between the first housing 200 and the second housing 300, and the third housing 600 may cover the outside of the hinge 2, and may be used to protect the hinge 2.

As the electronic device 1000 is unfolded from the folded state to the flat state, the space between the side of the first housing 200 and the side of the second housing 300 may be gradually narrowed, and the opposite sides of the third housing 600 may be inserted into the first housing 200 and the second housing 300. When the electronic device 1000 is in a flat state, the third housing 600 may be covered by the first backplane 400 and the second backplane 500 and not be exposed to the outside.

As the electronic device 1000 is bent from the flat state to the folded state, the space between the side of the first housing 200 and the side of the second housing 300 may be gradually widened, and the third housing 600 may be gradually exposed by the first housing 200 and the second housing 300. When the electronic device 1000 is in a fully folded state, at least a portion of the third housing 600 may be exposed to the outside from between the sides of the first housing 200 and the sides of the second housing 300, and the first and second backplanes 400 and 500 may still cover some of the remaining portions of the third housing 600.

The hinge 2 further includes a support member 30 including a first support plate 31, the first support plate 31 is positioned between the flexible portion 101 and the moving mechanism, the first support plate 31 is connected to the moving mechanism to approach or move away from the fixing bracket 10 under the driving of the moving mechanism.

When the electronic device 1000 is in the flat state, the flexible portion 101 is also in the flat state, and the first support plate 31 is far away from the fixing bracket 10 and supports the flexible portion 101. At this time, the flexible portion 101 is supported by the first support plate 31, and the first portion 102 and the second portion 103 are supported by the front sides of the first housing 200 and the second housing 300, respectively. The first support plate 31 can reduce the step difference between the flexible portion 101 and the first portion 102 and the second portion 103, thereby being capable of improving the flatness of the flexible display panel 100 and reducing the crease of the flexible portion 101.

When the electronic device 1000 is in the folded state, the flexible portion 101 is in the bent state, and the first support plate 31 is close to the fixing bracket 10, thereby providing a space for accommodating the flexible portion 101, and preventing the flexible portion 101 from being pressed by the first support plate 31 during bending.

Further, when the electronic device 1000 is in the folded state, the flexible portion 101 is in the bent state, and there is a gap between the first support plate 31 and the flexible portion 101, and thus it is ensured that the space for accommodating the flexible portion 101 provided by the first support plate 31 is larger than the deformation amount of the flexible portion 101, thereby preventing the flexible portion 101 from being pressed by the first support plate 31 when the flexible portion 101 is in the folded state.

Figure 4:
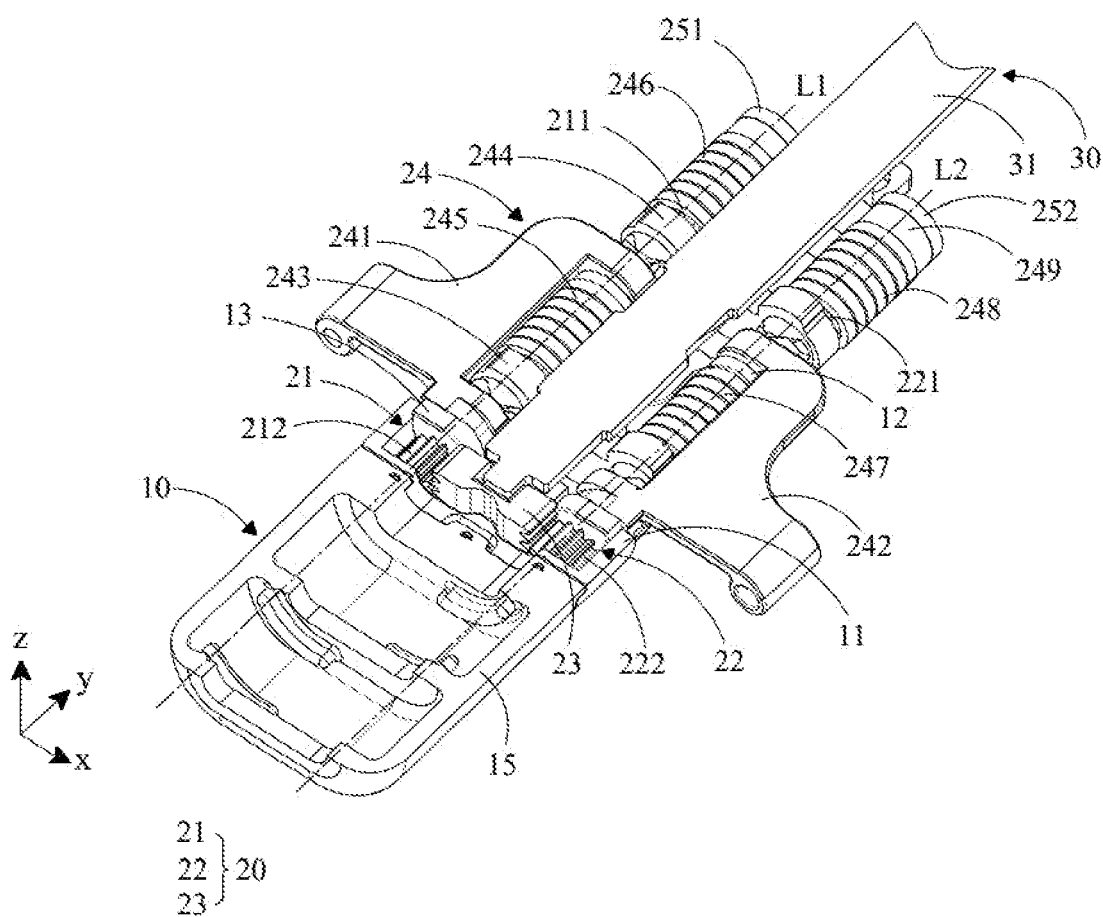
FIG. 4 is a schematic structural diagram of a first hinge according to an embodiment of the present disclosure.
Figure 12:
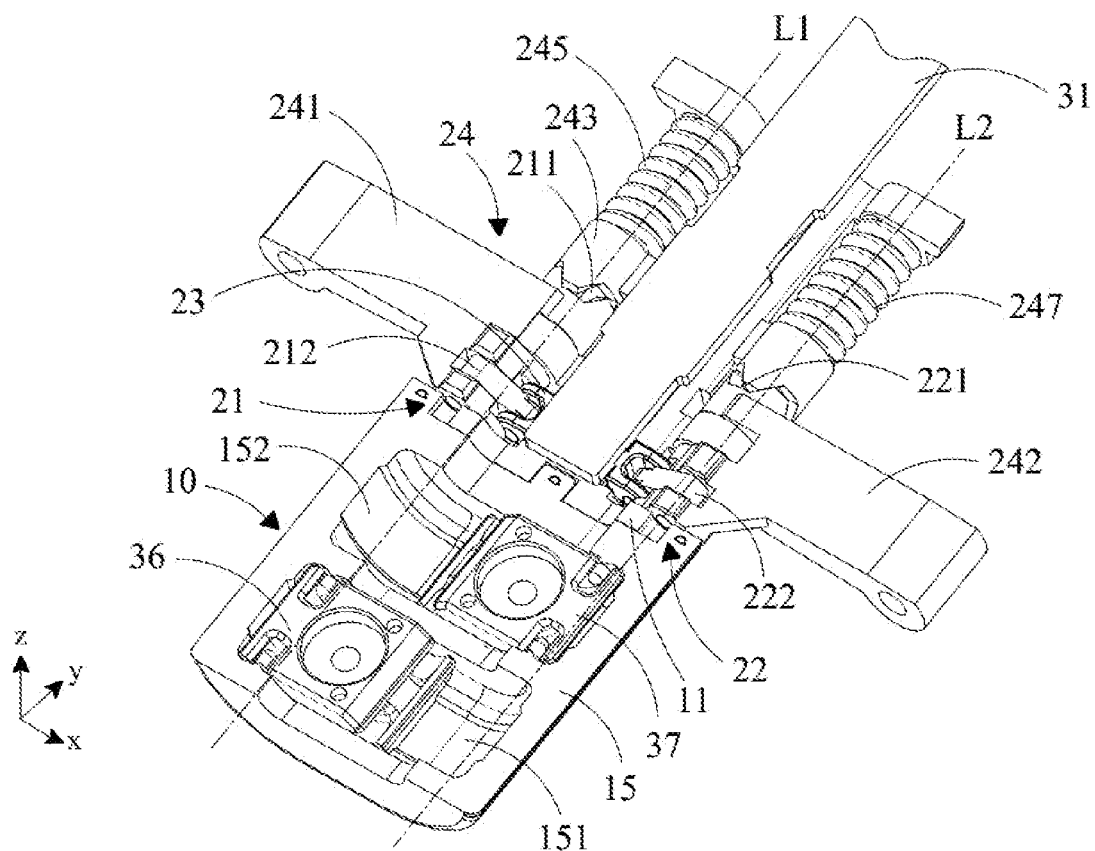
FIG. 12 is a schematic structural diagram of the second hinge according to an embodiment of the present disclosure.

As shown in FIGS. 3, 4 and 12, FIG. 4 is a schematic structural diagram of a first hinge according to an embodiment of the present disclosure, FIG. 12 is a schematic structural diagram of a second hinge according to an embodiment of the present disclosure. The moving mechanism 20 includes a rotating mechanism and a movement block 23, the rotating mechanism is rotatably connected to the fixing bracket 10, the movement block 23 is movably connected to the rotating mechanism, and the first support plate 31 is connected to the movement block 23.

The rotating mechanism includes a first rotating mechanism 21 and a second rotating mechanism 22, the first rotating mechanism 21 and the second rotating mechanism 22 are movably connected to the fixing bracket 10, respectively, and the first rotating mechanism 21 and the second rotating mechanism 22 are disposed opposite to each other. The rotating axes include a first axis L1 and a second axis L2, the first axis L1 and the second axis L2 are parallel to the second direction y and spaced apart from each other in the first direction x, and the first rotating mechanism 21 is rotatable about the first axis L1 and the second rotating mechanism 22 is rotatable about the second axis L2. In the embodiment of the present disclosure, the first rotating mechanism 21 and the second rotating mechanism 22 have the same structure. In the actual application, the structures of the first rotating mechanism 21 and the second rotating mechanism 22 may be the same or different, and it is not limited herein.

The movement block 23 is movably connected to the first rotating mechanism 21 and the second rotating mechanism 22. During folding or unfolding of the electronic device 1000, the movement block 23 moves only in the third direction z or a reverse direction opposite to the third direction z, so that the first rotating mechanism 21 and the second rotating mechanism 22 can maintain synchronous movement.

The first rotating mechanism 21 includes a first rotating member 211 rotatably connected to the fixing bracket 10, and a first transmission member 212 fixedly connected to the first rotating member 211, and the first transmission member 212 is movably connected to the movement block 23. The second rotating mechanism 22 includes a second rotating member 221 rotatably connected to the fixing bracket 10, and a second transmission member 222 fixedly connected to the second rotating member 221, and a second transmission member 222 is movably connected to the movement block 23.

Figure 5:
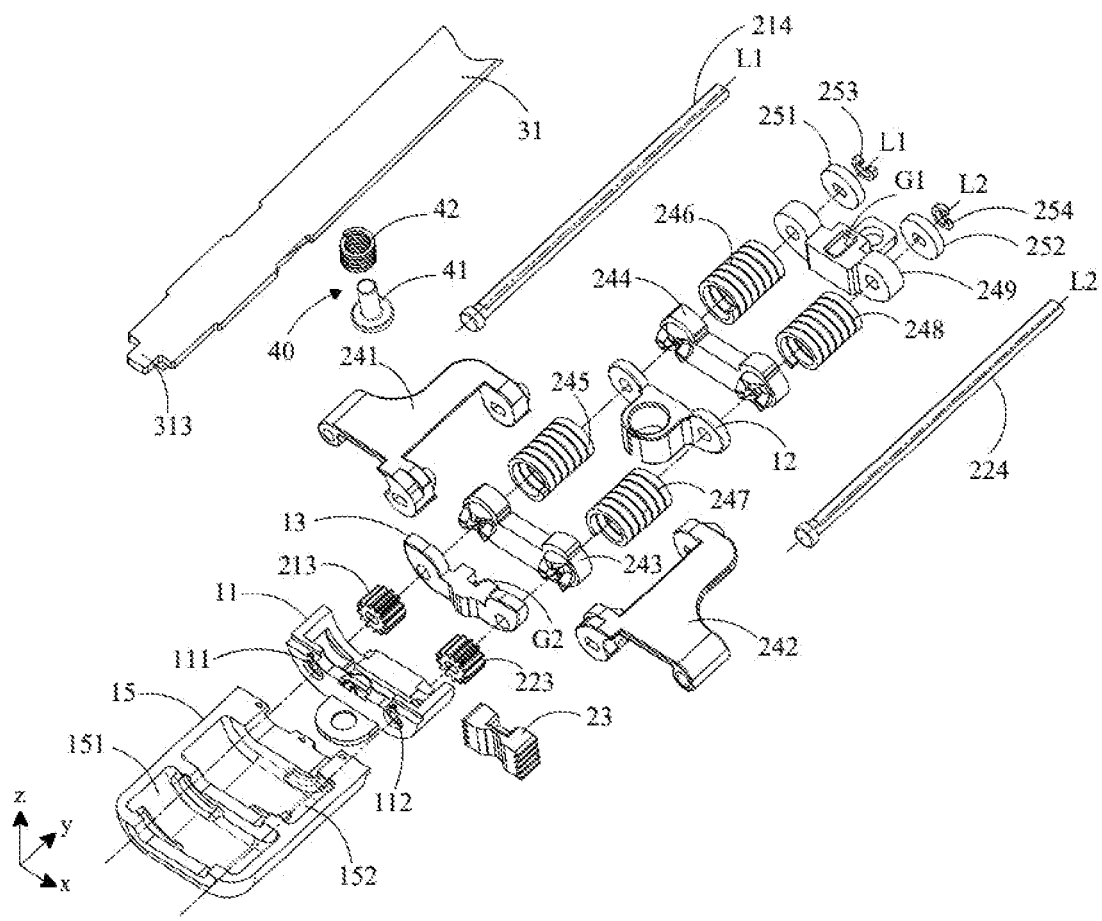
FIG. 5 is an exploded schematic view of the first hinge according to an embodiment of the present disclosure.
Figure 6:
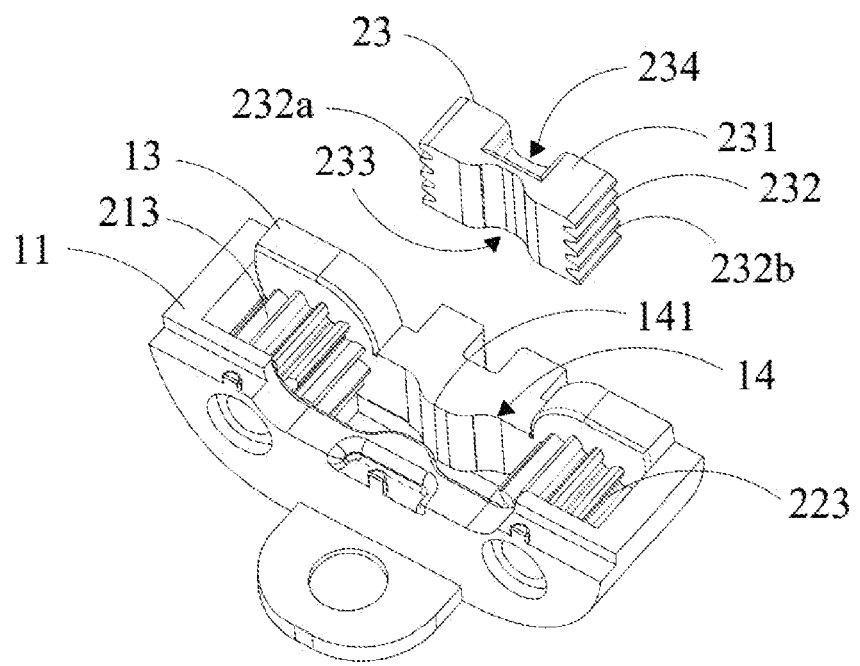
FIG. 6 is a schematic structural diagram of a first movement block and a first fixing bracket according to an embodiment of the present disclosure.

In an embodiment, as shown in FIGS. 4 to 6, FIG. 5 is an exploded schematic view of a first hinge according to an embodiment of the present disclosure, FIG. 6 is a schematic structural view of a first movement block and a first fixing bracket according to an embodiment of the present disclosure. The first transmission member 212 includes a first gear 213 sleeved on the first rotating member 211, and the second transmission member 222 includes a second gear 223 sleeved on the second rotating member 221.

The fixing bracket 10 includes a first fixing bracket 11 provided with a first shaft hole 111 and a second shaft hole 112 spaced apart in the first direction x. The first rotating member 211 includes a first rotating shaft 214 whose axis coincides with the first axis L1, the first rotating shaft 214 passes through the first shaft hole 111 and is rotatable relative to the first fixing bracket 11. The first gear 213 is sleeved on the first rotating shaft 214 along the first axis L1, and is fixedly connected to the first rotating shaft 214.

The second rotating member 221 includes a second rotating shaft 224 whose axis coincides with the second axis L2, the second rotating shaft 224 passes through the second shaft hole 112 and is rotatable relative to the first fixing bracket 11.

The second gear 223 is sleeved on the second rotating shaft 224 along the second axis L2, and is fixedly connected to the second rotating shaft 224.

The connection mode between the first gear 213 and the first rotating shaft 214 and the connection mode between the second gear 223 and the second rotating shaft 224 includes but is not limited to key connection or interference fit connection.

The movement block 23 includes a base portion 231 and a rack 232 disposed outside the base portion 231. The rack 232 includes a first rack 232a and a second rack 232b, the first rack 232a and the second rack 232b are located on opposite sides of the base portion 231, the first gear 213 meshes with the first rack 232a, and the second gear 223 meshes with the second rack 232b.

Preferably, the base portion 231 and the rack 232 are integrally formed so that the number of components in the hinge 2 can be reduced, thereby reducing the difficulty of assembling the hinge 2. In a practical application, the base portion 231 and the rack 232 may be two separate parts, and the rack 232 may be fixedly connected to the base portion 231 by the manner including but not limited to gluing, snap-fit, or threaded connection.

Figure 9:
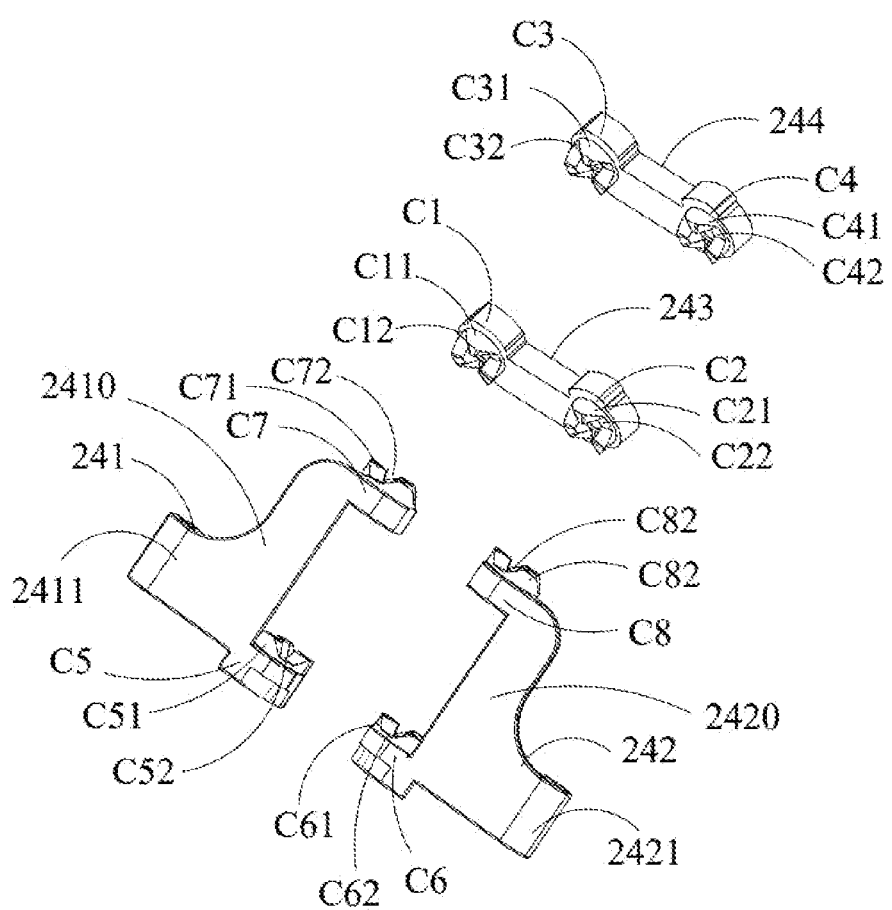
FIG. 9 is an exploded schematic view of a first holding mechanism according to an embodiment of the present disclosure.

As shown in FIGS. 4, 5 and 9, FIG. 9 is an exploded schematic view of a first holding mechanism according to an embodiment of the present disclosure, the first hinge 2 provided in the embodiment of the present disclosure further includes a holding mechanism 24 including a first holding arm 241 and a second holding arm 242. The first holding arm 241 includes a first body portion 2410, and a fifth cam C5 and a seventh cam C7, and the fifth cam C5 and the seventh cam C7 protrude from the same side of the first body portion 2410 in the first direction x and are arranged at intervals. Each of the fifth cam C5 and the seventh cam C7 is provided with a shaft hole, the fifth cam C5 and the seventh cam C7 are sleeved on the first rotating shaft 214 and are fixedly connected to the first rotating shaft 214, and the first holding arm 241 may rotate about the first axis L1 and drive the first rotating shaft 214 to rotate synchronously.

The second holding arm 242 includes a second body portion 2420, and a sixth cam C6 and an eighth cam C8, and the sixth cam C6 and the eighth cam C8 protrude from the same side of the second body portion 2420 in a direction opposite to the first direction x and are arranged at intervals. Each of the sixth cam C6 and the eighth cam C8 is provided with a shaft hole, the sixth cam C6 and the eighth cam C8 are sleeved on the second rotating shaft 224 and fixedly connected to the second rotating shaft 224, and the second holding arm 242 may rotate about the second axis L2 and drive the second rotating shaft 224 to rotate synchronously.

Figure 7:
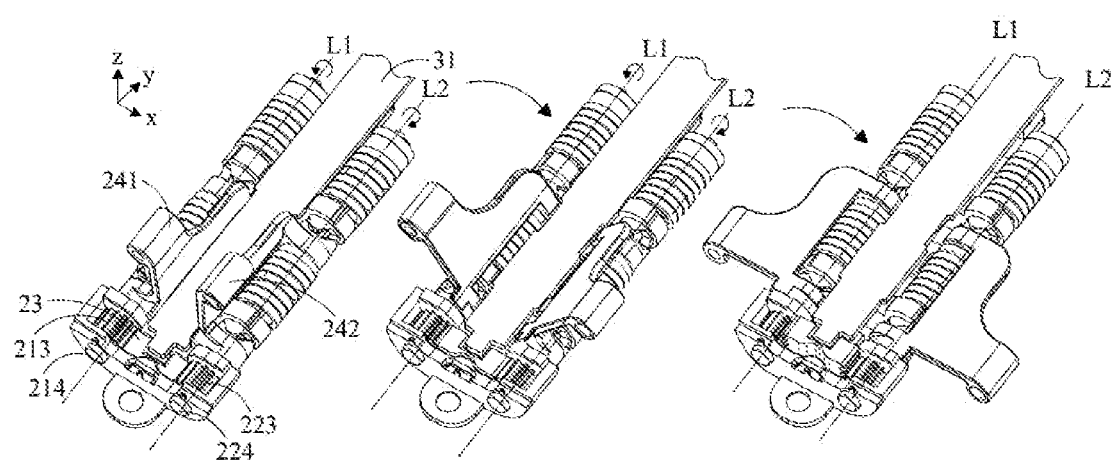
FIG. 7 is a schematic diagram of an unfolding process of the first hinge according to an embodiment of the present disclosure.

As shown in FIG. 7, FIG. 7 is a schematic diagram of the unfolding process of the first hinge according to the embodiment of the present disclosure. From left to right, the hinge is unfolded from the fully folded state to the flat state. The process of folding or unfolding of the hinge is reversible, and from right to left, it can be seen as a process in which the hinge is folded from the flat state to the fully folded state.

During the unfolding of the hinge, the first holding arm 241 rotates the first rotating shaft 214 about the first axis L1 in the direction indicated by the arrow, the first gear 213 rotates in the same direction as the first rotating shaft 214, the second holding arm 242 rotates the second rotating shaft 224 about the second axis L2 in the direction indicated by the arrow, and the second gear 223 rotates in the same direction as the second rotating shaft 224. The movement block 23 moves linearly in the third direction z under the meshing action of the gear and the rack. During the movement of the movement block 23 in the third direction z, the movement block 23 comes into contact with the first support plate 31 and applies a force parallel to the third direction z to the first support plate 31 to drive the first support plate 31 to move in the same direction as the movement block 23.

During the folding of the hinge, the first holding arm 241 rotates the first rotating shaft 214 about the first axis L1 in a direction opposite to that indicated by the arrow, the first gear 213 rotates in the same direction as the first rotating shaft 214, the second holding arm 242 rotates the second rotating shaft 224 about the second axis L2 in a direction opposite to that indicated by the arrow, and the second gear 223 rotates in the same direction as the second rotating shaft 224. The movement block 23 moves in a direction opposite to the third direction z under the meshing action of the gear and the rack, and the first support plate 31 also moves in the direction opposite to the third direction z.

During the folding or unfolding of the hinge, the movement block 23 is always moved linearly in the third direction z or a direction opposite to the third direction z, and the meshing speed between the first gear 213 and the first rack 232a is the same as the meshing speed between the second gear 223 and the second rack 232b, so that the rotational speeds of the first gear 213 and the second gear 223 are the same, thereby achieving the effect of synchronized rotation of the first rotating mechanism 21 and the second rotating mechanism 22.

Figure 13:
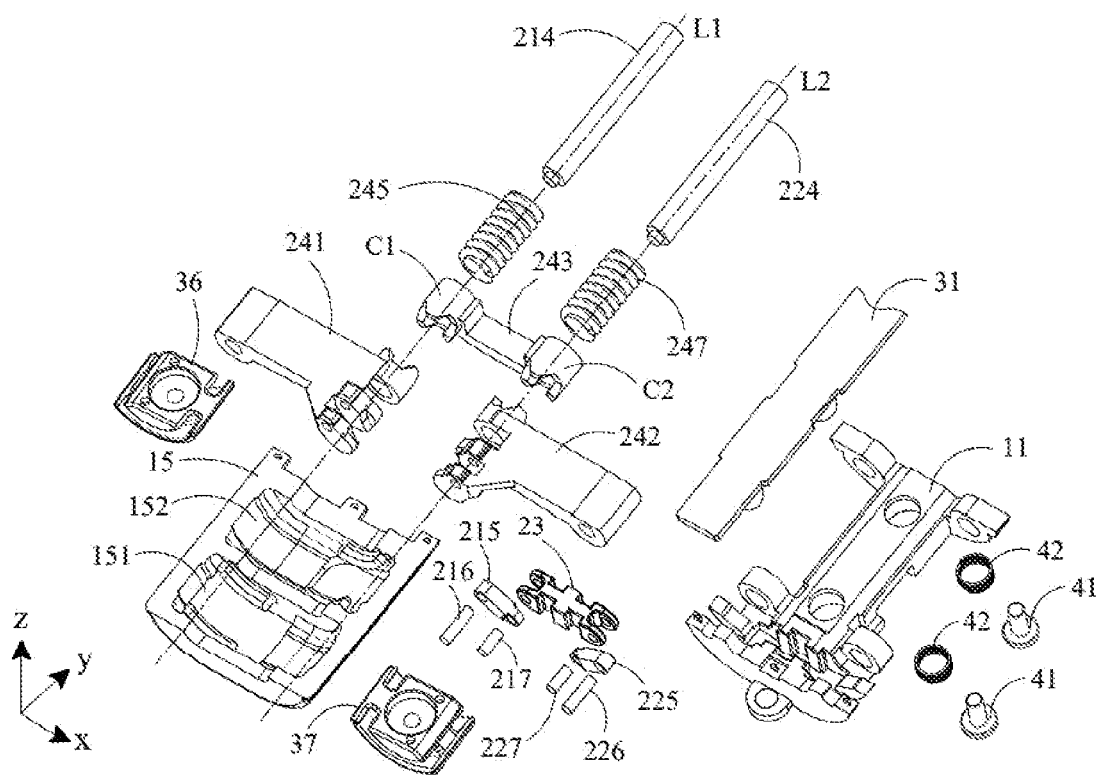
FIG. 13 is an exploded schematic view of the second hinge according to an embodiment of the present disclosure.

In an embodiment, as shown in FIGS. 12 and 13, FIG. 13 is an exploded schematic view of a second hinge according to an embodiment of the present disclosure, the first transmission member 212 includes a first link 215, one end of the first link 215 is fixedly connected to the first rotating member 211, and the other end of the first link 215 is movably connected to the movement block 23. The second transmission member 222 includes a second link 225, one end of the second link 225 is fixedly connected to the second rotating member 221, and the other end of the second link 225 is rotatably connected to the movement block 23.

Figure 14:
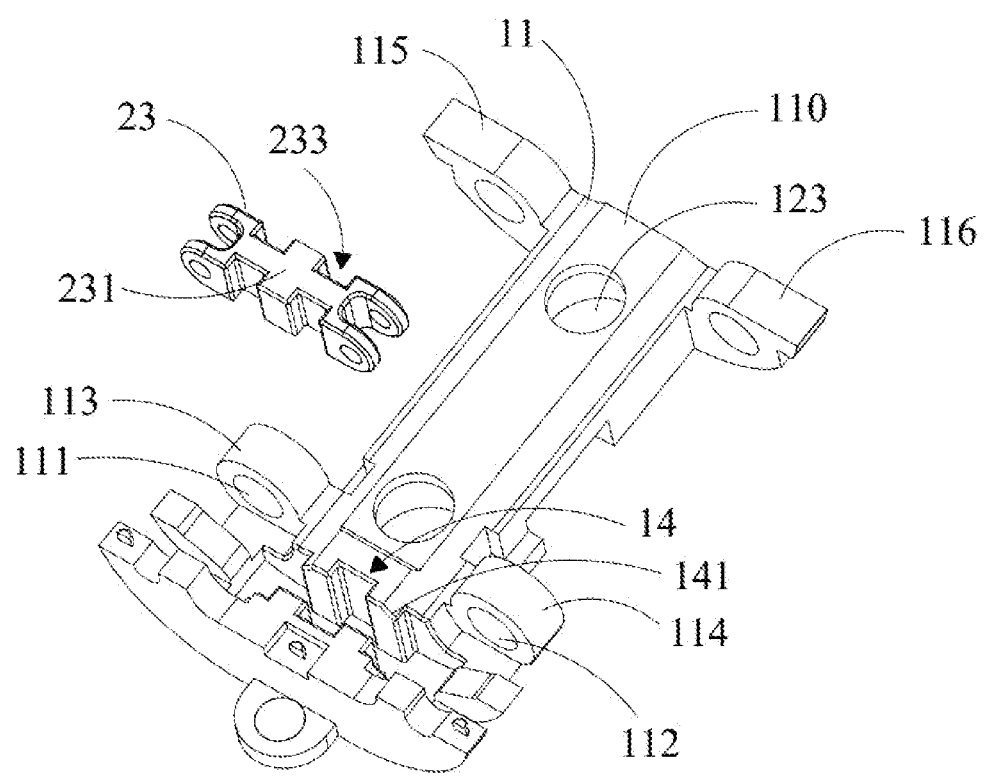
FIG. 14 is a schematic structural diagram of a second movement block and a first fixing bracket according to an embodiment of the present disclosure.

Referring to FIGS. 12 to 14, FIG. 14 is a schematic structural diagram of a second movement block and a first fixing bracket according to an embodiment of the present disclosure, the fixing bracket 10 includes a first fixing bracket 11, the first fixing bracket 11 includes a bracket body portion 110, a first bracket connecting portion 113 and a third bracket connecting portion 115, and a second bracket connecting portion 114 and a fourth bracket connecting portion 116, the first bracket connecting portion 113 and the third bracket connecting portion 115 protrude from the bracket body portion 110 in a direction opposite to the first direction x and are arranged at intervals in the second direction y, and the second bracket connecting portion 114 and the fourth bracket connecting portion 116 protrude from the bracket body portion 110 in the first direction x and are arranged at intervals in the second direction y. The first bracket connecting portion 113 is provided with a first shaft hole 111, the second bracket connecting portion 114 is provided with a second shaft hole 112, and the third bracket connecting portion 115 and the fourth bracket connecting portion 116 are also provided with shaft holes.

As shown in FIG. 12, the second hinge 2 provided by the embodiment of the present disclosure further comprises the holding mechanism 24, the holding mechanism 24 comprises the first holding arm 241 and the second holding arm 242, the first holding arm 241 includes a first body portion 2410, and a seventh connecting portion 2412 and a fifth cam C5 protruding from the same side of the first body portion 2410 in the first direction x and arranged at intervals. The fifth cam C5 is sleeved on the first rotating shaft 214 and can rotate with respect to the first rotating shaft 214. The seventh connecting portion 2412 is provided with a first groove 2413, and both side walls of the first groove 2413 are provided with shaft holes.

The second holding arm 242 includes a second body portion 2420, and a sixth cam C6 and an eighth connecting portion 2422, the sixth cam C6 and the eighth connecting portion 2422 protrude from the same side of the second body portion 2420 in a direction opposite to the first direction x and are arranged at intervals. The sixth cam C6 is sleeved on the second rotating shaft 224 and can rotate with respect to the second rotating shaft 224. The eighth connecting portion 2422 is formed with a second groove 2423, and both side walls of the second groove 2423 are provided with shaft holes.

The movement block 23 includes a base portion 231, and first and second extension portions 235 and 236 connected to opposite sides of the base portion 231. Each of the first and second extension portions 235 and 236 includes two opposite extension plates extending from the base portion 231 in the first direction x or the direction opposite to the first direction x. One end of the first link 215 is fixedly connected to the first rotating member 211, the other end of the first link 215 is rotatably connected between the two extension plates of the first extension portion 235 of the movement block 23, one end of the second link 225 is fixedly connected to the second rotating member 221, and the other end of the second link 225 is rotatably connected between the two extension plates of the second extension portion 236 of the movement block 23.

Specifically, the first extending portion 235 includes a first extending plate 235a and a second extending plate 235b which are opposed and spaced apart. The first extending plate 235a and the second extending plate 235b are provided with coaxial shaft holes. The second extending portion 236 includes a third extending plate 236a and a fourth extending plate 236b which are opposed and spaced apart, both the third extending plate 236a and the fourth extending plate 236b are provided with coaxial shaft holes.

Referring to FIGS. 12 to 15, FIG. 15 is a schematic structural view of a first rotating member and a second rotating member in a second hinge according to an embodiment of the present disclosure. The first rotating member 211 includes a first rotating shaft 214, a third rotating shaft 216, and a fifth rotating shaft 217, the axis of the first rotating shaft 214 coincides with the first axis L1, and the first rotating shaft 214 passes through the first bracket connecting portion 113, the third bracket connecting portion 115, and the fifth cam C5; both ends of the first link 215 are provided with shaft holes. The first end of the first link 215 extends into the first groove 2413 of the seventh connecting portion 2412 of the first holding arm 241, the third rotating shaft 216 passes through the first end of the first link 215 and the seventh connecting portion 2412 of the first holding arm 241, the first holding arm 241 may rotate about the third rotating shaft 216, and the first link 215 is fixedly connected to the third rotating shaft 216. The second end of the first link 215 extends between the first extension plate 235a and the second extension plate 235b of the first extension portion 235 of the movement block 23, and the fifth rotating shaft 217 passes through the second end of the first link 215 and the first extension portion 235. The first link 215 may rotate about the fifth rotating shaft 217, and the movement block 23 is fixedly connected to the fifth rotating shaft 217.

The second rotating member 221 includes a second rotating shaft 224, a fourth rotating shaft 226 and a sixth rotating shaft 227, the axis of the second rotating shaft 224 coincides with the second axis L2, and the second rotating shaft 224 passes through the second bracket connecting portion 114 and the fourth bracket connecting portion 116; both ends of the second link 225 are provided with shaft holes. The first end of the second link 225 extends into the second groove 2423 of the second holding arm 242. The fourth rotating shaft 226 passes through the first end of the second link 225 and the eighth connecting portion 2422 of the second holding arm 242, the eighth connecting portion 2422 may rotate about the fourth rotating shaft 226, and the second link 225 is fixedly connected to the fourth rotating shaft 226. The second end of the second link 225 extends between the third extension plate 236a and the fourth extension plate 236b of the second extension portion 236 of the movement block 23, and the sixth rotating shaft 227 passes through the second end of the second link 225 and the second extension portion 236. The second link 225 may rotate about the sixth rotating shaft 227, and the movement block 23 is fixedly connected to the sixth rotating shaft 227.

Figure 16:
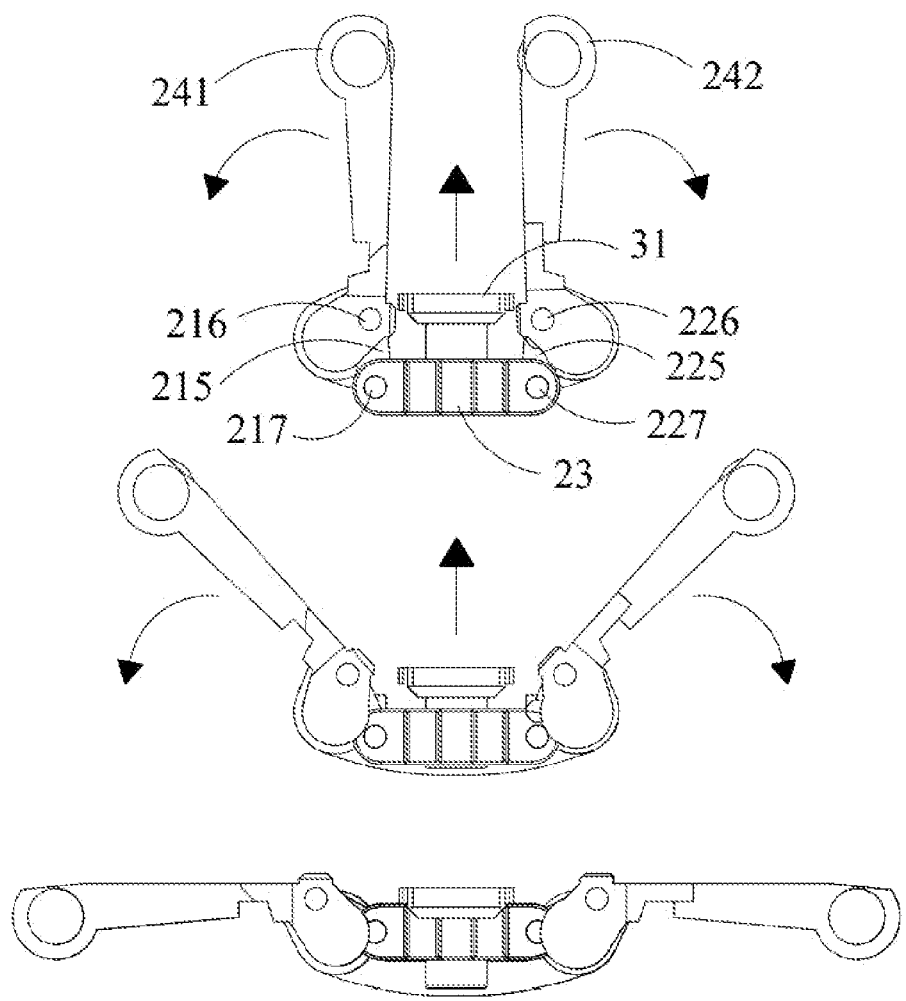
FIG. 16 is a schematic diagram of an unfolding process of the second hinge according to an embodiment of the present disclosure.

Referring to FIGS. 12 and 16, FIG. 16 is a schematic diagram of an unfolding process of a second hinge according to an embodiment of the present disclosure. During the unfolding process of the hinge, the first holding arm 241 drives the third rotating shaft 216 to rotate about the first axis L1 in the direction of the arrow shown in the figure, and the third rotating shaft 216 drives the first link 215 to rotate about the fifth rotating shaft 217 in the direction of the arrow shown in the figure. The second holding arm 242 drives the fourth rotating shaft 226 to rotate about the second axis L2 in the direction of the arrow shown in the figure, the fourth rotating shaft 226 drives the second link 225 to rotate about the sixth rotating shaft 227 in the direction of the arrow shown in the figure, and the movement block 23 is driven by the first link 215 and the second link 225 to move linearly in the direction of the arrow shown in the figure (i.e., the third direction z). During the movement of the movement block 23 in the third direction z, the movement block 23 comes into contact with the first support plate 31 and applies a force to the first support plate 31 in the direction of the arrow shown in the figure, thereby driving the first support plate 31 to move in the same direction as that of the movement block 23.

During a folding process of the hinge, the first holding arm 241 drives the third rotating shaft 216 to rotate about the first axis L1 in a direction opposite to the direction of the arrow shown in the figure, and the third rotating shaft 216 drives the first link 215 to rotate about the fifth rotating shaft 217 in a direction opposite to the direction of the arrow shown in the figure. The second holding arm 242 drives the fourth rotating shaft 226 to rotate about the second axis L2 in a direction opposite to the direction of the arrow shown in the figure, the fourth rotating shaft 226 drives the second link 225 to rotate about the sixth rotating shaft 227 in a direction opposite to the direction of the arrow shown in the figure, the movement block 23 is driven by the first link 215 and the second link 225 to move linearly in a direction opposite to the direction of the arrow shown in the figure (i.e., a direction opposite to the third direction z), and the first support plate 31 moves in the same direction as that of the movement block 23.

During the unfolding or folding of the hinge, the movement block 23 is always moved linearly in the third direction z or the direction opposite to the third direction z, so that the angle of relative rotation of the first link 215 and the second link 225 can be kept consistent, thereby achieving the effect of synchronous rotation of the first and second rotating mechanisms.

The hinge 2 further includes a fixing mechanism 40 including a first fixing member 41 and a first elastic member 42, the first fixing member 41 passes through the fixing bracket 10 and is fixedly connected to the first support plate 31, one end of the first elastic member 42 is connected to the fixing bracket 10, and the other end of the first elastic member 42 is connected to the first fixing member 41. When the flexible portion 101 is in the flat state or the bent state, the first elastic member 42 is in the elastically deformed state.

Figure 8:
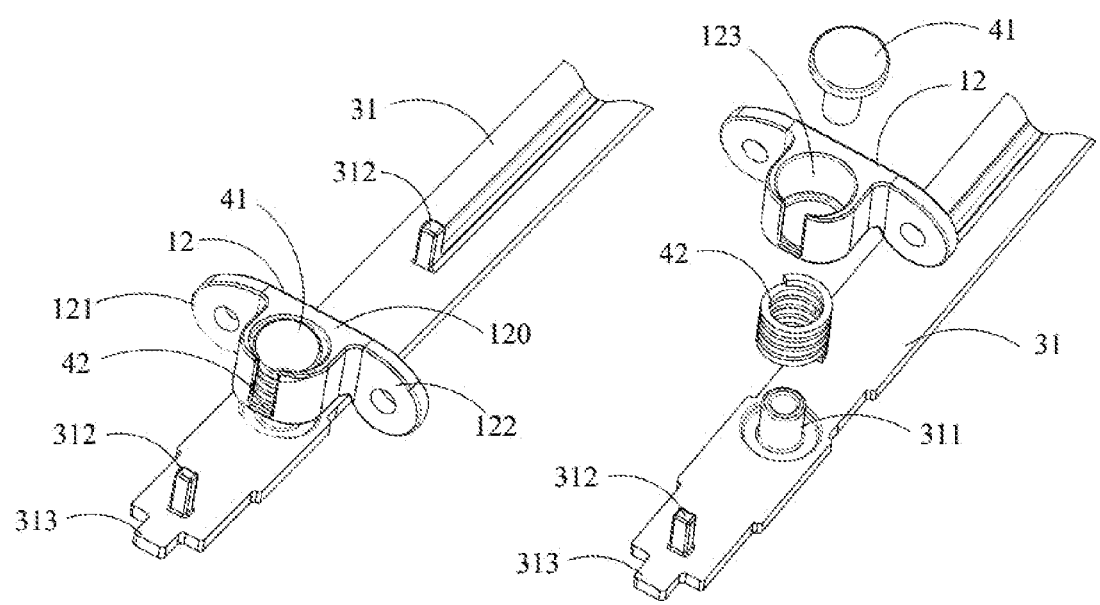
FIG. 8 is a schematic structural diagram of a fixing mechanism according to an embodiment of the present disclosure.

In an embodiment, referring to FIGS. 4, 5 and 8, FIG. 8 is a schematic structural diagram of the fixing mechanism provided in the embodiment of the present disclosure. The fixing bracket 10 in the first hinge provided in the embodiment of the present disclosure further includes a fixing block 12, the fixing block 12 includes a body portion 120 and a first connecting portion 121 and a second connecting portion 122 extending from opposite sides of the body portion 120. The first rotating member 211 passes through the first connecting portion 121, and the second rotating member 221 passes through the second connecting portion 122. The body portion 120 is provided with a through hole 123 which penetrates through the body portion 120 in the third direction z. The first fixing member 41 penetrates through the through hole 123 and is fixedly connected to the first support plate 31, and one end of the first elastic member 42 is connected to inner wall of the body portion 120 around the through hole 123.

Each of the first connecting portion 121 and the second connecting portion 122 is provided with a shaft hole, and the first rotating shaft 214 passes through the shaft hole of the first connecting portion 121 and is rotatable with respect to the fixing block 12, and the second rotating shaft 224 passes through the shaft hole of the second connecting portion 122 and is rotatable with respect to the fixing block 12.

In an embodiment, the fixing bracket 10 in the second hinge provided by the embodiment of the present disclosure may not include the fixing block 12, but may directly connect the fixing mechanism 40 and the first fixing bracket 11. With reference to FIGS. 12 to 14, FIG. 14 is a schematic structural diagram of a second movement block and a first fixing bracket according to an embodiment of the present disclosure. The bracket body 110 of the first fixing bracket 11 is provided with two through holes 123 spaced apart from each other and penetrating through the bracket body 110 in the third direction z. The fixing mechanism 40 includes two first fixing members 41 and two first elastic members 42, the first fixing members 41 passes through the first fixing bracket 11 through the through hole 123 and is fixedly connected to the first support plate 31, and one end of the first elastic members 42 is connected to the inner wall of the first fixing bracket 11 surrounding the through hole 123.

In practical application, the number of the first fixing member 41 and the first elastic member 42 included in the fixing mechanism 40 is not limited to one or two in the above-described embodiment, but may be three or more.

In an embodiment, as shown in FIGS. 8 and 12, the first fixing member 41 may be a fixing screw, the first support plate 31 is provided with a column 311 protruding from the bottom surface of the first support plate 311 on a side of the first support plate 31 near the fixing block 12. The column 311 is provided with a threaded hole. The column 311 passes through the through hole 123 and is fixedly connected to the fixing screw in a manner of the threaded connection.

In an embodiment, as shown in FIGS. 8 and 12, the first elastic member 42 is a spring. In practical application, the first elastic member 42 is not limited to the above-described spring, but may be a steel plate, a rubber-plastic block, a plastic block, or the like, having an elasticity deformation restorability.

When the electronic device 1000 is in the fully folded state, the first elastic member 42 is in the elastically deformed state, that is, the spring is compressed, and a preload force is applied to the first support plate 31 by the first elastic member 42 to prevent the first support plate 31 and the fixing mechanism 40 from shaking in the fully folded state.

During the unfolding of the electronic device 1000, the first and second rotating mechanisms 21 and 22 drive the movement block 23 to move in the third direction z. The movement block 23 contacts the first support plate 31 during the movement, and applies a thrust force parallel to the third direction z to the first support plate 31 so as to drive the first support plate 31 and the movement block 23 to move in the same direction, so that the first support plate 31 gradually moves away from the fixing bracket 10. The first fixing member 41 and the first support plate 31 move in the same direction, and the first elastic member 42 is pressed by the first fixing member 41 and the fixing bracket 10, so that the elastic deformation of the first elastic member 42 is increased, that is, the amount of compression of the spring is gradually increased until the electronic device 1000 is unfolded to a flat state.

When the electronic device 1000 is in the flat state, the amount of elastic deformation of the first elastic member 42 is greater than the amount of elastic deformation in the folded state, that is, the amount of compression of the spring in the flat state is greater than the amount of compression in the folded state. During the folding of the electronic device 1000, the first elastic member 42 applies a thrust force opposite to the third direction z to the first fixing member 41, so that the first support plate 31 moves in the direction opposite to the third direction z and gradually approaches the fixing bracket 10.

In an embodiment, as shown in FIGS. 5 and 8, a plurality of guide posts 312 are provided on the bottom surface of the first support plate 31, and a first guide groove G1 is provided on a first stopper 249 of the holding mechanism 24. The first guide groove G1 penetrates through the first stopper 249 in the third direction z. A second guide groove G2 is provided on a second stopper 13, and penetrates through the second stopper 13 in the third direction z. The guide posts 312 are slidably mounted in the first and second guide grooves G1 and G2, respectively. By providing the plurality of guide posts 312 and the first and second guide grooves G1 and G2, it is possible to define that the first support plate 31 can be moved linearly only in the third direction z or a direction opposite to the third direction z, thereby preventing the first support plate 31 from shaking during the movement.

In practical application, the number of the guide posts 312 includes but is not limited to 1, 2, 3 or more, the arrangement positions of the guide grooves are not limited to the first stopper 249 and the second stopper 13, the guide grooves may be disposed on the first fixing bracket 11.

In an embodiment, as shown in FIGS. 4 to 8, a stopper groove 234 is provided on the movement block 23, and a stopper portion 313 corresponding to the stopper groove 234 is provided at one end of the first support plate 31 close to the movement block 23. When the electronic device 1000 is in the flat state, the stopper portion 313 can be engaged into the stopper groove 234, to prevent the flexible portion 101 from protruding from the plane where the first portion 102 and the second portion 103 are located due to the excessive stroke of the movement block 23 causing the first support plate 31 to rise too high, thereby ensuring the flatness of the flexible display panel 100. At the same time, the stopper groove 234 can be used to fix and limit the first support plate 31 to prevent the first support plate 31 from shaking when the electronic device 1000 is in the flat state.

The first fixing bracket 10 is provided with a first sliding groove 14, the movement block 23 is slidably mounted into the first sliding groove 14. The wall surface of the first sliding groove 14 is provided with a protrusion 141. The movement block 23 is provided with a groove 233, and the protrusion 141 is slidably accommodated in the groove 233.

In an embodiment, as shown in FIGS. 5 and 6, the fixing bracket 10 in the first hinge provided in the embodiment of the present disclosure further includes a second stopper 13 having two connecting portions protruding from the body of the second stopper 13 in the first direction x, each of the two connecting portions is provided with a shaft hole, the first rotating shaft 214 and the second rotating shaft 224 pass through the shaft hole respectively, and are rotatable relative to the second stopper 13. The second stopper 13 is engaged with the first fixing bracket 11, and surrounds a first sliding groove 14 with the first fixing bracket 11. The movement block 23 is slidably mounted into the first sliding groove 14, and can only move linearly in the first sliding groove 14 in a third direction z or a direction opposite to the third direction z, thereby ensuring that the first and second rotating mechanisms 21 and 22 can rotate synchronously, and avoiding a situation in which the movement block 23 is stuck during sliding.

Further, each of the first fixing bracket 11 and the second stopper 13 is provided with a protrusion 141 on their sides close to each other, a groove 233 is disposed on each of the opposite sides of the base portion 231 of the movement block 23, and the protrusion 141 is slidably accommodated into the groove 233. In this way, the movement direction of the movement block 23 is further limited by the protrusion 141, to prevent the movement block 23 from skewing to the left or right, thereby reducing the gap between the movement block 23 and the first slide groove 14 and increasing the stability of the movement block 23 during the movement.

In an embodiment, as shown in FIG. 14, the first sliding groove 14 in the second hinge provided in the embodiment of the present disclosure is formed in the bracket body portion 110 of the first fixing bracket 11, the first sliding groove 14 penetrates the bracket body portion 110 in the third direction z, and the movement block 23 is slidably mounted into the first sliding groove 14. Two grooves 233 spaced apart from each other are provided on each of opposite sides of the base portion 231 of the movement block 23, and two protrusions 141 are provided on each of opposite sidewalls of the first sliding groove 14. The protrusions 141 are accommodated in the grooves 233.

In practical application, the number of grooves 233 provided on the movement block 23 and the number of protrusions 141 on the sidewalls of the first sliding groove 14 can be set according to the size of the movement block 23 and the size of the first sliding groove 14. The larger the size of the movement block 23 and the first sliding groove 14, the more the number of the grooves 233 and the protrusions 141 are required, thereby improving the stability of the movement block 23 in the first sliding groove 14. The number of grooves 233 disposed on the movement block 23 and the number of protrusions 141 on the sidewalls of the first sliding groove 14 can be set according to the actual situation, and it is not limited herein.

The holding mechanism 24 further includes the first holding member 243, the first holding member 243 is provided with first protrusions C11 and second protrusions C21, the first holding arm 241 is provided with first grooves C52, the second holding arm 242 is provided with second grooves C62, the first holding arm 241 is connected to the first rotating member 211, the second holding arm 242 is connected to the second rotating member 221, and the first rotating member 211 and the second rotating member 221 are rotatably connected to the first holding member 243. When the flexible portion 101 is in one of a flat state and a bent state, the first groove C52 accommodates the first protrusion C11, and the second groove C62 accommodates the second protrusion C21. When the flexible portion 101 is in another of a flat state and a bent state, the first protrusion C11 disengages from the first groove C52, and the second protrusion C21 disengages from the second groove C62.

In one embodiment, referring to FIGS. 4, 5 and 9, FIG. 9 is an exploded schematic view of a first holding mechanism according to an embodiment of the present disclosure. The first holding member 243 is provided with a first cam C1 and a second cam C2 protruding from opposite sides of the main body of the first holding member 243.

The first cam C1 may include a plurality of first protrusions C11 protruding from an edge of the first cam C1 in a direction opposite to the second direction y, a fifth groove C12 is provided between adjacent first protrusions C11, and the first rotating shaft 214 passes through the first cam C1, and may rotate relative to the first cam C1.

The second cam C2 may include a plurality of second protrusions C21 protruding from an edge of the second cam C2 in a direction opposite to the second direction y, a sixth groove C22 is provided between adjacent second protrusions C21, and the second rotating shaft 224 passes through the second cam C2, and may rotate relative to the second cam C2.

The fifth cam C5 of the first holding arm 241 may include a plurality of fifth protrusions C51 protruding from the edge of the fifth cam C5 in the second direction y, the first groove C52 is provided between adjacent fifth protrusions C51, and the first rotating shaft 214 passes through the fifth cam C5. The sixth cam C6 of the second holding arm 242 may include a plurality of sixth protrusions C61 protruding from the edge of the sixth cam C6 in the second direction y, a second groove C62 is provided between adjacent sixth protrusions C61, and the second rotating shaft 224 passes through the sixth cam C6.

The holding mechanism 24 further includes a second holding member 244 provided with third protrusions C31 and fourth protrusions C41, third grooves C72 are provided on the first holding arm 241, fourth grooves C82 are provided on the second holding arm 242. When the flexible portion is in one of the flat state and the bent state, the third groove C72 accommodates the third protrusion C31, and the fourth groove C82 accommodates the fourth protrusion C41. When the flexible portion 101 is in another of the flat state and the bent state, the third protrusion C31 disengages from the third groove C72, and the fourth protrusion C41 disengages from the fourth groove C82.

As shown in FIGS. 5 and 9, the second holding member 244 is provided with a third cam C3 and a fourth cam C4 protruding from the main body of the second holding member 244.

The third cam C3 may include a plurality of third protrusions C31 protruding from an edge of the third cam C3 in a direction opposite to the second direction y, a seventh groove C32 is provided between adjacent third protrusions C31, and the first rotating shaft 214 passes through the third cam C3, and may rotate relative to the third cam C3.

The fourth cam C4 may include a plurality of fourth protrusions C41 protruding from an edge of the fourth cam C4 in a direction opposite to the second direction y, an eighth groove C42 is provided between adjacent fourth protrusions C41, a second rotating shaft 224 passes through the fourth cam C4, and may rotate relative to the fourth cam C4.

The seventh cam C7 of the first holding arm 241 may include a plurality of seventh protrusions C71 protruding from the edge of the seventh cam C7 in the second direction y, a third groove C72 is provided between adjacent seventh protrusions C71, and a first rotating shaft 214 passes through the seventh cam C7. The eighth cam C8 of the second holding arm 242 may include a plurality of eighth protrusions C81 protruding from the edge of the eighth cam C8 in the second direction y, a fourth groove C82 is provided between adjacent eighth protrusions C81, and a second rotating shaft 224 passes through the eighth cam C8.

Each of the first to eighth protrusions C11 to C81 has a flat end having a sliding surface which is a connecting surface between two inclined sides of each protrusion.

The holding mechanism 24 further includes a second elastic member 245, a third elastic member 246, a fourth elastic member 247, a fifth elastic member 248, and a first stopper 249. The second elastic member 245, the third elastic member 246, the fourth elastic member 247, and the fifth elastic member 248 are all springs. The first stopper 249 includes a third connecting portion and a fourth connecting portion protruding from both sides of the main body of the first stopper 249 in the first direction x. The third connecting portion and the fourth connecting portion are each provided with a shaft hole. The first rotating shaft 214 passes through the third connecting portion, and the second rotating shaft 224 passes through the fourth connecting portion.

The second elastic member 245 and the third elastic member 246 are sleeved on the first rotating member 211, the second elastic member 245 is sandwiched between the first holding member 243 and the first connecting portion 121, and the third elastic member 246 is sandwiched between the second holding member 244 and the third connecting portion of the first stopper 249; the fourth elastic member 247 and the fifth elastic member 248 are sleeved on the second rotating member 221, the fourth elastic member 247 is sandwiched between the first holding member 243 and the second connecting portion 122, and the fifth elastic member 248 is sandwiched between the second holding member 244 and the fourth connecting portion of the first stopper 249.

When the electronic device 1000 is in the flat state or the fully folded state, the flexible portion 101 is in the flat state or the fully folded state, the first cam C1 is generally engaged with the fifth cam C5, the second cam C2 is generally engaged with the sixth cam C6, the third cam C3 is generally engaged with the seventh cam C7, and the fourth cam C4 is generally engaged with the eighth cam C8.

The general engagement means, for example, that the first protrusion C11 of the first cam C1 is accommodated in the first groove C52 of the fifth cam C5, and the fifth groove C12 accommodates the fifth protrusion C51; the second protrusion C21 of the second cam C2 is accommodated in the second groove C62 of the sixth cam C6, and the sixth groove C22 accommodates the sixth protrusion C61; the third protrusion C31 of the third cam C3 is accommodated in the third groove C72 of the seventh cam C7, and the seventh groove C32 accommodates the seventh protrusion C71; the fourth protrusion C41 of the fourth cam C4 is accommodated in the fourth groove C82 of the eighth cam C8, and the eighth groove C42 accommodates the eighth protrusion C81.

When the electronic device 1000 is in the transition folded state, the flexible portion 101 is in the bent state, the first cam C1 is in open engagement with the fifth cam C5, the second cam C2 is in open engagement with the sixth cam C6, the third cam C3 is in open engagement with the seventh cam C7, and the fourth cam C4 is in open engagement with the eighth cam C8.

The open engagement means, for example, that: the first protrusion C11 of the first cam C1 is disengaged from the first groove C52 of the fifth cam C5, and the sliding surface of the first protrusion C11 is in contact with the sliding surface of the fifth protrusion C51; the second protrusion C21 of the second cam C2 is disengaged from the second groove C62 of the sixth cam C6, and the sliding surface of the second protrusion C21 is in contact with the sliding surface of the sixth protrusion C61; the third protrusion C31 of the third cam C3 is disengaged from the third groove C72 of the seventh cam C7, and the sliding surface of the third protrusion C31 is in contact with the sliding surface of the seventh protrusion C71; the fourth protrusion C41 of the fourth cam C4 is disengaged from the fourth groove C82 of the eighth cam C8, and the sliding surface of the fourth protrusion C41 is in contact with the sliding surface of the eighth protrusion C81.

During the process of folding the electronic device 1000 from the flat state to the transition folded state, the first holding arm 241 rotates clockwise about the first axis L1, the second holding arm 242 rotates counterclockwise about the second axis L2, each of the mutually engaged cams gradually changes from the general engagement to the open engagement, the first protrusion C11 is gradually disengaged from the first groove C52, the second protrusion C21 is gradually disengaged from the second groove C62, the third protrusion C31 is gradually disengaged from the third groove C72, and the fourth protrusion C41 is gradually disengaged from the fourth groove C82. Each of the second elastic member 245 to the fifth elastic member 248 is compressed, resulting in a gradual increase in the amount of elastic deformation of each elastic member. When the angle between the first portion 102 and the second portion 103 of the flexible display panel body is 0 to 30 degrees, the electronic device 1000 can be restored to a flat state without external force under the action of the pressing force of each elastic member and the pressure angle of the cam.

When the electronic device 1000 is in the transition folded state, each cam engaged with each other changes to open engagement, the pressure angle of each cam is zero, the angle between the first portion 102 and the second portion 103 of the flexible display panel body can be maintained at 30 to 150 degrees, the elastic deformation amount of each elastic member remains constant, and the electronic device 1000 can be maintained in the transition folded state without external force.

When the electronic device 1000 is folded from the transition folded state to the fully folded state, each of the mutually engaged cams is gradually changed from the open engagement to the general engagement, the first protrusion C11 is gradually accommodated in the first groove C52, the second protrusion C21 is gradually accommodated in the second groove C62, the third protrusion C31 is gradually accommodated in the third groove C72, and the fourth protrusion C41 is gradually accommodated in the fourth groove C82, and the elastic deformation amount of each elastic member is gradually reduced. When the angle between the first portion 102 and the second portion 103 of the flexible display panel body is 150 to 180 degrees, the electronic device 1000 can be automatically folded from the transition folded state to the fully folded state without external force, under the action of the pressing force of each elastic member and the pressure angle of the cam.

In one embodiment, the holding mechanism 24 may include only one holding member and a pair of elastic members. As shown in FIGS. 12 to 14, the holding mechanism 24 in the second hinge provided in the embodiment of the present disclosure may include a first holding member 243, a second elastic member 245, and a fourth elastic member 247, the structure of the first holding member 243 is same as a structure of the first holding member 243 shown in FIG. 4, and it will not be repeated here.

The bottom surface of the bracket body portion 110 of the first fixing bracket 11 is provided with a chucking groove, the body of the first holding member 243 is engaged with the chucking groove, the first cam C1 and the second cam C2 of the first holding member 243 protrude from opposite sides of the bracket body portion 110, the first cam C1 is positioned between the first bracket connecting portion 113 and the third bracket connecting portion 115, and the second cam C2 is positioned between the second bracket connecting portion 114 and the fourth bracket connecting portion 116. The second elastic member 245 is sandwiched between the first cam C1 and the third bracket connecting portion 115, and the fourth elastic member 247 is sandwiched between the second cam C2 and the fourth bracket connecting portion 116.

Figure 15:
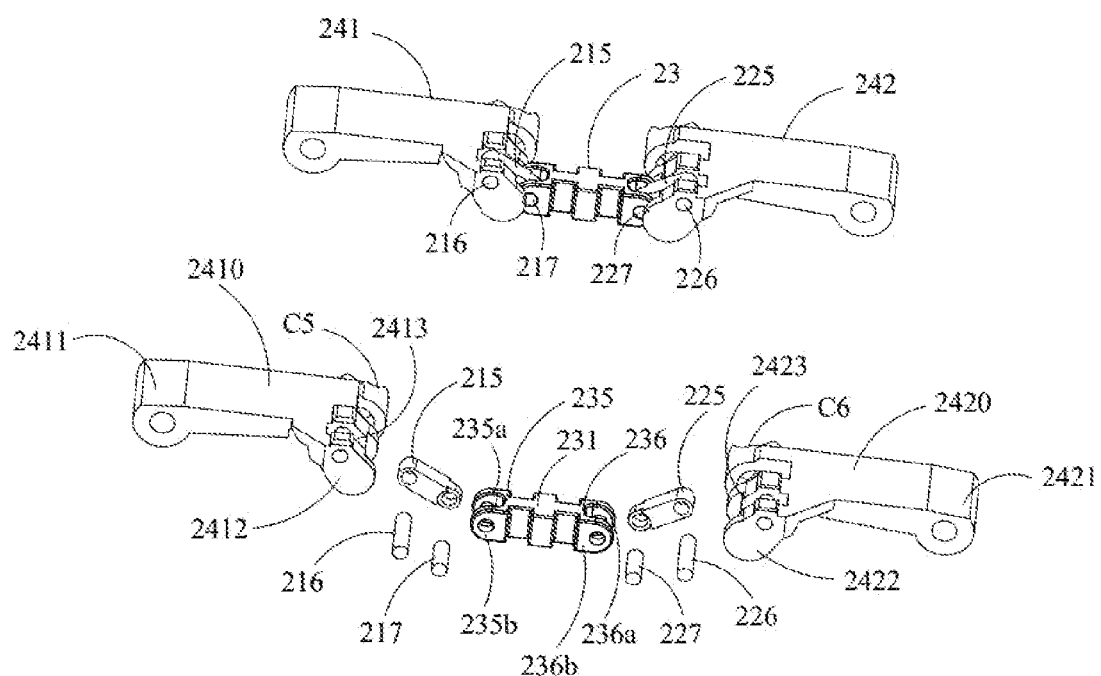
FIG. 15 is a schematic structural view of a first rotating member and a second rotating member in the second hinge according to an embodiment of the present disclosure.

As shown in FIGS. 13 and 15, the fifth cam C5 of the first holding arm 241 is engaged with the first cam C1 of the first holding member 243, and the sixth cam C6 of the second holding arm 242 is engaged with the second cam C2 of the first holding member 243. The principle of operation of the holding mechanism 24 formed by the first holding arm 241 and the second holding arm 242, the first holding member 243, the second elastic member 245, and the fourth elastic member 247 is the same as that of the holding mechanism in the first hinge shown in FIG. 4, and the technical effect similar to that of the holding mechanism in the first hinge shown in FIG. 4 can be realized, and it will not be repeated here.

In an actual application, the number of the holding members in the holding mechanism 24 is not limited to one or two in the above-described embodiment, but can also be 3 or 4 or more. The number of elastic members needs to be adapted to the number of holding members. For an electronic device with a larger size, the number of holding members required is greater.

As shown in FIGS. 4 and 5, the first hinge provided in the embodiment of the present disclosure further includes a first stopper piece 251, a second stopper piece 252, a first fixing clip 253, and a second fixing clip 254. The first stopper piece 251 and the first fixing clip 253 are sequentially sleeved on one end of the first rotating shaft 214 passing through the first stopper 249, and the second stopper piece 252 and the second fixing clip 254 are sequentially sleeved on one end of the second rotating shaft 224 passing through the first stopper 249, thereby fixing the first stopper 249 and preventing the first rotating shaft 214 and the second rotating shaft 224 from being separated from the hinge.

Figure 10:
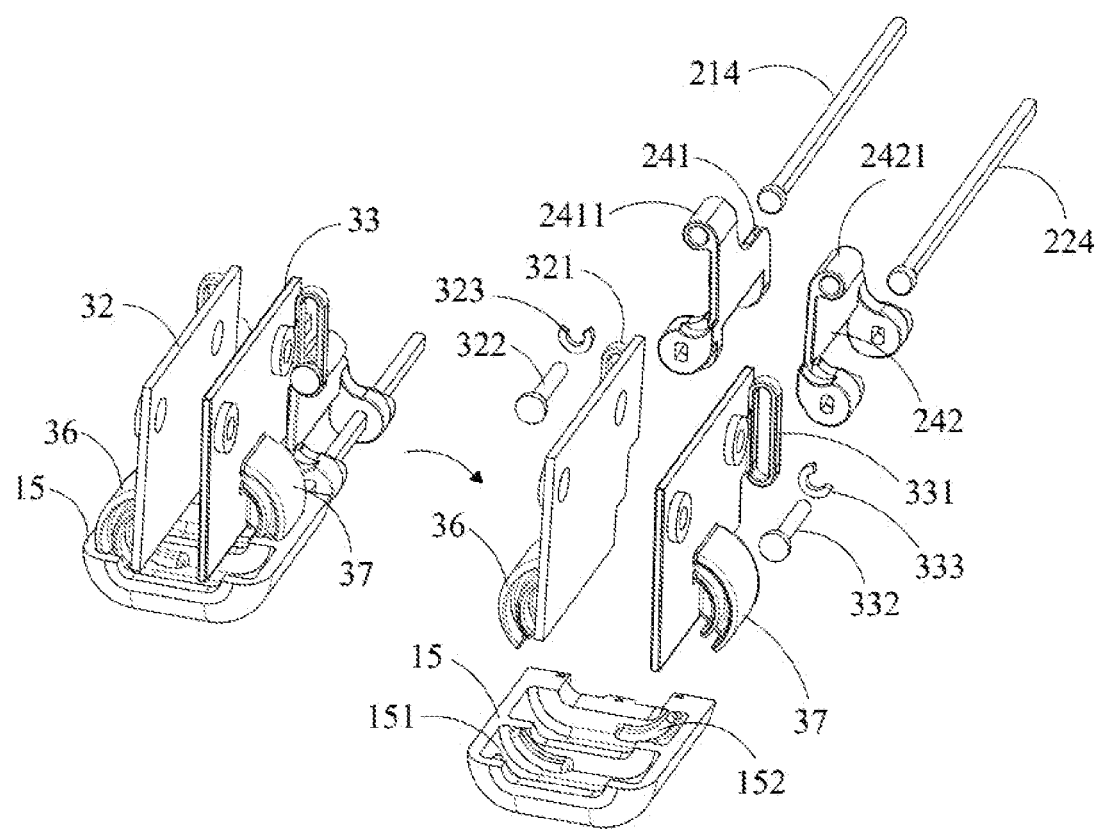
FIG. 10 is a schematic structural diagram of a second support plate and a third support plate according to an embodiment of the present disclosure.

As shown in FIG. 10, FIG. 10 is a schematic structural diagram of a second support plate and a third support plate according to an embodiment of the present disclosure, the support member 30 further includes a second support plate 32 and a third support plate 33, the second support plate 32 is connected to the first holding arm 241 to move under the driving of the first holding arm 241, and the third support plate 33 is connected to the second holding arm 242 to move under the driving of the second holding arm 242. The second support plate 32 is fixedly connected to the front side of the first housing 200 by screws, the second support plate 32 may be used to support the first portion 102, the third support plate 33 is fixedly connected to the front side of the second housing 300 by screws, and the third support plate 33 may be used to support the second portion 103.

The second support plate 32 is provided with a second sliding groove 321, and the third support plate 33 is provided with a third sliding groove 331. Both the second sliding groove 321 and the third sliding groove 331 are linear sliding grooves. The first holding arm 241 includes a fifth connection portion 2411 protruding from the first body portion 2410 in a direction opposite to the first direction x, and the second holding arm 242 includes a sixth connection portion 2421 protruding from the second body portion 2420 in the first direction x. Each of the fifth connecting portion 2411 and the sixth connecting portion 2421 is provided with a shaft hole.

The hinge 2 further includes a second fixing member 322, a third fixing member 332, a third fixing clip 323, and a fourth fixing clip 333, the second fixing member 322 and the third fixing member 332 are pin shafts. The second fixing member 322 passes through the second sliding groove 321 and the shaft hole of the fifth connecting portion 2411 and is fixedly connected to the first holding arm 241. The third fixing clip 323 is sleeved on one end of the second fixing member 322 passing through the fifth connecting portion 2411, and the second fixing member 322 is slidable and rotatable relative to the second sliding groove 321. The third fixing member 332 passes through the third sliding groove 331 and the shaft hole of the sixth connecting portion 2421 and is fixedly connected to the second holding arm 242. The fourth fixing clip 333 is sleeved on one end of the third fixing member 332 passing through the sixth connecting portion 2421, and the third fixing member 332 is slidable and rotatable relative to the third sliding groove 331.

The hinge 2 further includes a first slider 36 and a second slider 37, the second fixing bracket 15 is provided with a fourth sliding groove 151 and a fifth sliding groove 152, the first slider 36 may be slidably mounted into the fourth sliding groove 151, and the second slider 37 may be slidably mounted into the fifth sliding groove 152.

In an embodiment, as shown in FIG. 10, in the first hinge provided in the embodiment of the present disclosure, the first slider 36 is integrally formed with the second support plate 32, and the second slider 37 is integrally formed with the third support plate 33.

In an embodiment, as shown in FIGS. 12 and 13, in the second hinge provided in the embodiment of the present disclosure, the first slider 36 and the second support plate 32 may be two independent parts, and the first slider 36 and the second support plate 32 may be fixedly connected by the threaded connection or the snap-fit. The second slider 37 and the third support plate 33 may be two separate parts, and the second slider 37 and the third support plate 33 may be fixedly connected by the threaded connection or the snap-fit.

The position of the second fixing member 322 in the second sliding groove 321 when the flexible portion 101 is in the flat state is different from the position of the second fixing member 322 in the second sliding groove 321 when the flexible portion 101 is in the bent state; the position of the third fixing member 332 in the third sliding groove 331 when the flexible portion 101 is in the flat state is different from the position of the third fixing member 332 in the third sliding groove 331 when the flexible portion 101 is in the bent state.

Figure 11:
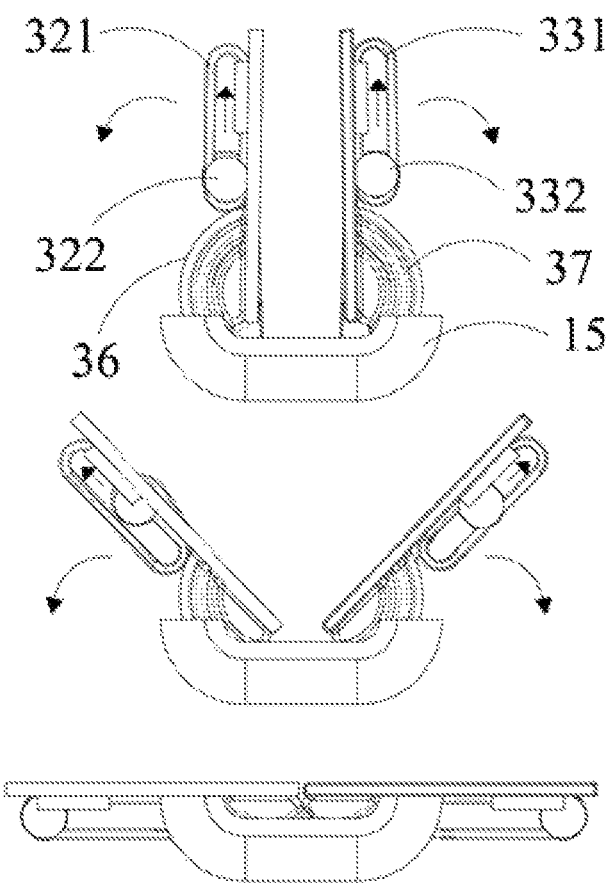
FIG. 11 is a schematic diagram of a movement of the second support plate and the third support plate according to an embodiment of the present disclosure.

As shown in FIG. 11, FIG. 11 is a schematic diagram of a movement of a second support plate and a third support plate according to an embodiment of the present disclosure, when the electronic device 1000 is in a fully folded state, the second fixing member 322 is located at one end of the second sliding groove 321 close to the second fixing bracket 15, and the third fixing member 332 is located at one end of the third sliding groove 331 close to the second fixing bracket 15.

During process of the electronic device 1000 being unfolded from the fully folded state to the flat state, and the second and third support plates 32 and 33 are rotated away from each other in the direction of the arrows shown in the figure respectively. During the rotation of the second support plate 32 in the direction of the arrow shown in the figure, the second fixing member 322 drives the first holding arm 241 to rotate in the same direction, and the second fixing member 322 slides in the second sliding groove 321 in the direction of the arrow shown in the figure, and gradually moves away from the second fixing bracket 15. During the rotation of the third support plate 33 in the direction of the arrow shown in the figure, the third fixing member 332 drives the second holding arm 242 to rotate in the same direction, and the third fixing member 332 slides in the third sliding groove 331 in the direction of the arrow shown in the figure, and gradually moves away from the second fixing bracket 15.

When the electronic device 1000 is in the flat state, the flexible portion 101 is in the flat state, the second fixing member 322 is in one end of the second sliding groove 321 away from the second fixing bracket 15, and the third fixing member 332 is in one end of the third sliding groove 331 away from the second fixing bracket 15.

As shown in FIGS. 3, the support member 30 further includes the fourth support plate 34 and the fifth support plate 35, the fourth support plate 34 is fixedly connected to the front side of the first housing 200 by screws, and the fourth support plate 34 and the second support plate 32 are on the same plane to support the first portion 102; the fifth support plate 35 is fixedly connected to the second housing 300 by screws, and the fifth support plate 35 and the third support plate 33 are on the same plane to support the second portion 103.

The advantageous effects of the embodiments of the present disclosure are: an embodiment of the present disclosure provides a hinge, a flexible display panel, and an electronic device, the electronic device includes a flexible display panel including a flexible display panel body and a hinge, the flexible display panel body includes a flexible portion, the hinge includes a fixing bracket, a rotating mechanism and a support member, and the moving mechanism is movably connected to the fixing bracket, when the flexible portion is in a flat state, a first support plate is far away from the fixing bracket and supports the flexible portion, so that a step difference between the flexible portion and other portions of the flexible display panel body is reduced, thereby improving flatness of the flexible display panel and reducing creases of the flexible portion. When the flexible portion is in a bent state, the first support plate is far away from the flexible portion, thereby providing a space for accommodating the flexible display panel and preventing the flexible display panel from being pressed during bending.

In summary, although the present disclosure discloses the foregoing preferred embodiment, the foregoing preferred embodiment is not intended to limit the present disclosure. A person of ordinary skill in the art may make various changes and finishes without departing from the spirit and scope of the present disclosure. Therefore, the protection scope of the present application is based on the scope defined by the claims.

What is claimed is:

1. A flexible display panel, comprising:
   a flexible display panel body comprising a flexible portion; and
   a hinge comprising:
   a fixing bracket;
   a moving mechanism movably connected to the fixing bracket; and
   a support member comprising a first support plate, the first support plate is positioned between the flexible portion and the moving mechanism and connected to the moving mechanism to approach or move away from the fixing bracket under driving of the moving mechanism,
   wherein when the flexible portion is in a flat state, the first support plate is away from the fixing bracket and supports the flexible portion, when the flexible portion is in a bent state, the first support plate approaches the fixing bracket,
   wherein the moving mechanism comprises:
   a rotating mechanism rotatably connected to the fixing bracket; and
   a movement block movably connected to the rotating mechanism, the first support plate is connected to the movement block,
   wherein the rotating mechanism comprises:
   a first rotating mechanism rotatably connected to the fixing bracket; and
   a second rotating mechanism rotatably connected to the fixing bracket and disposed opposite to the first rotating mechanism, and
   wherein the movement block is movably connected to the first rotating mechanism and the second rotating mechanism.

2. The flexible display panel of claim 1, wherein, when the flexible portion is in the bent state, there is a gap between the first support plate and the flexible portion.

3. The flexible display panel of claim 1, wherein the fixing bracket is provided with a first sliding groove, the movement block is slidably mounted in the first sliding groove, and
   wherein a protrusion is disposed on a wall surface of the first sliding groove, the movement block is provided with a groove, and the protrusion is slidably accommodated in the groove.

4. The flexible display panel of claim 1, wherein the first rotating mechanism comprises a first rotating member and a first transmission member, and the second rotating mechanism comprises a second rotating member and a second transmission member, and
   wherein the first rotating member is rotatably connected to the fixing bracket, the first transmission member is fixedly connected to the first rotating member, the first transmission member is movably connected to the movement block, the second rotating member is rotatably connected to the fixing bracket, the second transmission member is fixedly connected to the second rotating member, and the second transmission member is movably connected to the movement block.

5. The flexible display panel of claim 4, wherein the first transmission member comprises a first gear, the second transmission member comprises a second gear, and the movement block comprises a rack, and
   wherein the first gear is sleeved on the first rotating member, the second gear is sleeved on the second rotating member, and both the first gear and the second gear are engaged with the rack.

6. The flexible display panel of claim 5, wherein the movement block comprises a base portion, the rack is disposed outside of the base portion, and the base portion is integrally formed with the rack.

7. The flexible display panel of claim 4, wherein the first transmission member comprises a first link, and the second transmission member comprises a second link, and
   wherein one end of the first link is fixedly connected to the first rotating member, another end of the first link is rotatably connected to the movement block, one end of the second link is fixedly connected to the second rotating member, and another end of the second link is rotatably connected to the movement block.

8. The flexible display panel of claim 4, wherein the hinge further comprises a fixing mechanism, the fixing mechanism comprises a first fixing member and a first elastic member,
   wherein the first fixing member passes through the fixing bracket and is fixedly connected to the first support plate, one end of the first elastic member is connected to the fixing bracket, and another end of the first elastic member is connected to the first fixing member, and
   the first elastic member is in an elastically deformed state when the flexible portion is in the flat state or the bent state.

9. The flexible display panel of claim 8, wherein the fixing bracket comprises a fixing block, the fixing block comprises a body portion, and a first connecting portion and a second connecting portion extending from opposite sides of the body portion, and the body portion is provided with a through hole, and
   wherein the first rotating member passes through the first connection portion, the second rotating member passes through the second connection portion, the first fixing member passes through the through hole and is fixedly connected to the first support plate, and the one end of the first elastic member is connected to an inner wall of the body portion surrounding the through hole.

10. The flexible display panel of claim 9, wherein the hinge further comprises a holding mechanism, the holding mechanism comprises a first holding arm, a second holding arm and a first holding member, the first holding member is provided with a first protrusion and a second protrusion, the first holding arm is provided with a first groove, and the second holding arm is provided with a second groove,
    wherein the first holding arm is connected to the first rotating member, the second holding arm is connected to the second rotating member, and the first rotating member and the second rotating member are rotatably connected to the first holding member, and
    wherein when the flexible portion is in one of the flat state and the bent state, the first groove accommodates the first protrusion and the second groove accommodates the second protrusion, when the flexible portion is in another of the bent state and the flat state, the first protrusion is disengaged from the first groove and the second protrusion is disengaged from the second groove.

11. The flexible display panel of claim 10, wherein the holding mechanism further comprises a second holding member, the second holding member is provided with a third protrusion and a fourth protrusion, the first holding arm is provided with a third groove, and the second holding arm is provided with a fourth groove, and wherein when the flexible portion is in one of the flat state and the bent state, the third groove accommodates the third protrusion, and the fourth groove accommodates the fourth protrusion, when the flexible portion is in another of the bent state and the flat state, the third protrusion is disengaged from the third groove, and the fourth protrusion is disengaged from the fourth groove.

12. The flexible display panel of claim 11, wherein the holding mechanism further comprises a second elastic member, a third elastic member, a fourth elastic member, a fifth elastic member, and a first stopper, and wherein the second elastic member and the third elastic member are sleeved on the first rotating member, the second elastic member is sandwiched between the first holding member and the first connecting portion, and the third elastic member is sandwiched between the second holding member and the first stopper; the fourth elastic member and the fifth elastic member are sleeved on the second rotating member, the fourth elastic member is sandwiched between the first holding member and the second connecting portion, and the fifth elastic member is sandwiched between the second holding member and the first stopper.

13. The flexible display panel of claim 10, wherein the support member further comprises a second support plate and a third support plate, and the flexible display panel body comprises a first portion and a second portion on opposite sides of the flexible portion, and wherein the second support plate is connected to the first holding arm to move under a driving of the first holding arm, the third support plate is connected to the second holding arm to move under a driving of the second holding arm, the second support plate supports the first portion, and the third support plate supports the second portion.

14. The flexible display panel of claim 13, wherein the hinge further comprises a second fixing member and a third fixing member, the second support plate is provided with a second sliding groove, the third support plate is provided with a third sliding groove, the second fixing member passes through the second sliding groove and is fixedly connected to the first holding arm, and the third fixing member passes through the third sliding groove and is fixedly connected to the second holding arm, and wherein a position of the second fixing member in the second sliding groove when the flexible portion is in the flat state is different from a position of the second fixing member in the second sliding groove when the flexible portion is in the bent state; a position of the third fixing member in the third sliding groove when the flexible portion is in the flat state is different from a position of the third fixing member in the third sliding groove when the flexible portion is in the bent state.

15. An electronic device comprising a flexible display panel, the flexible display panel comprises:

a flexible display panel body comprising a flexible portion; and a hinge comprising:
a fixing bracket;
a moving mechanism movably connected to the fixing bracket; and
a support member comprising a first support plate positioned between the flexible portion and the moving mechanism, the first support plate is connected to the moving mechanism to approach or move away from the fixing bracket under a driving of the moving mechanism, and wherein when the flexible portion is in a flat state, the first support plate is away from the fixing bracket and supports the flexible portion; when the flexible portion is in a bent state, the first support plate is close to the fixing bracket, wherein the moving mechanism comprises:
a rotating mechanism rotatably connected to the fixing bracket; and
a movement block movably connected to the rotating mechanism, the first support plate is connected to the movement block, wherein the rotating mechanism comprises:
a first rotating mechanism rotatably connected to the fixing bracket; and
a second rotating mechanism rotatably connected to the fixing bracket and disposed opposite to the first rotating mechanism, and wherein the movement block is movably connected to the first rotating mechanism and the second rotating mechanism.

16. A hinge comprising:
a fixing bracket;
a moving mechanism movably connected to the fixing bracket; and
a support member comprising a first support plate connected to the moving mechanism to approach or move away from the fixing bracket under a driving of the moving mechanism, wherein the moving mechanism comprises:
a rotating mechanism rotatably connected to the fixing bracket; and
a movement block movably connected to the rotating mechanism, the first support plate is connected to the movement block, wherein the rotating mechanism comprises:
a first rotating mechanism rotatably connected to the fixing bracket; and
a second rotating mechanism rotatably connected to the fixing bracket and disposed opposite to the first rotating mechanism, and wherein the movement block is movably connected to the first rotating mechanism and the second rotating mechanism.

17. The hinge of claim 16, wherein the rotating mechanism comprises:

the first rotating mechanism comprising a first rotating member and a first transmission member; and the second rotating mechanism comprising a second rotating member and a second transmission member, and wherein the first rotating member is rotatably connected to the fixed bracket, the first transmission member is fixedly connected to the first rotating member, the second rotating member is rotatably connected to the fixing bracket, the second transmission member is fixedly connected to the second rotating member, and the movement block is movably connected to the first transmission member and the second transmission member.

* * * * *